(12) United States Patent
Nakashiba

(10) Patent No.: US 6,255,680 B1
(45) Date of Patent: Jul. 3, 2001

(54) SOLID-STATE IMAGE SENSOR

(75) Inventor: Yasutaka Nakashiba, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/281,227

(22) Filed: Mar. 30, 1999

(30) Foreign Application Priority Data

Mar. 30, 1998 (JP) ................................. 10-083179

(51) Int. Cl.$^7$ ..................... H01L 31/062; H01L 31/113
(52) U.S. Cl. ..................... 257/290; 257/291; 257/292; 438/66; 438/73
(58) Field of Search ..................... 257/290, 291, 257/292; 438/66, 73

(56) References Cited

U.S. PATENT DOCUMENTS 5,942,774 * 8/1999 Isogai et al. .................. 257/292
6,051,857 * 4/2000 Miida .................. 257/292

FOREIGN PATENT DOCUMENTS 8-241982 9/1996 (JP).
9-260628 10/1997 (JP).
63-13582 1/1998 (JP).

OTHER PUBLICATIONS

"Nikkei Microdevices" (7), pp. 120–125, (1997).

* cited by examiner

Primary Examiner—William Mintel
(74) Attorney, Agent, or Firm—Foley & Lardner

(57) ABSTRACT

There is provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a first region having a first electrical conductivity, extending to a gate electrode of the control transistor, and being in electrical connection with a gate electrode of the source follower transistor, and (b) a second region having a first electrical conductivity and formed adjacent to the first region. The solid-state image sensor reduces parasitic capacitance of the photoelectric transfer section to thereby enhance photoelectric transfer efficiency and sensitivity.

57 Claims, 18 Drawing Sheets

POTENTIAL

POTENTIAL

POTENTIAL

POTENTIAL

POTENTIAL

POTENTIAL

POTENTIAL

SOLID-STATE IMAGE SENSOR

BACKGROUND OF THE INVENTION

1. Field of the Invention

The invention relates to a solid-state image sensor, and more particularly to an active type XY addressable solid-state image sensor having compatibility with a process of fabricating CMOS transistor.

2. Description of the Related Art

Conventional solid-state image sensors can be grouped into MOS type and CCD type in accordance with a transfer layer for transferring signal charges generated by photoelectric transfer. In particular, CCD type solid-state image sensor has been widely used for VTR integrally including a camera, a digital camera, a fax machine and so on, and is presently being developed for enhancement in performances.

Some solid-state image sensors have compatibility with a process of fabricating CMOS transistor (hereinafter, such solid-state image sensors are referred to simply as "CMOS sensor"), as described in Nikkei Micro Device, Vol. 7, 1997, pp. 120–125. CMOS sensor has advantages that it can operate with a single power source such as a 5V or 3.3V cell with the result of low power consumption, that it can be fabricated in conventional CMOS fabrication process, and that peripheral circuits such as a signal processing circuit can be mounted on a common chip.

FIGS. 1 and 2 are cross-sectional views of a basic cell in CMOS sensor. FIG. 1 also illustrates a photoelectric transfer section in which electric charges are being accumulated, and FIG. 2 also illustrates a photoelectric transfer section from which electric charges have been reset.

With reference to FIG. 1, a basic cell of CMOS sensor is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a first n+ semiconductor region 104 sandwiched between the p-type well 102 and the p+ semiconductor region 103a, a second n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The basic cell of CMOS sensor is electrically connected to an external circuit through the second MOSFET 203.

The external circuit is comprised of at third MOSFET 204 acting as a load of the source follower amplifier 202, a fourth MOSFET 205 for transferring dark output, a fifth MOSFET 206 for transferring bright output, a first capacitor 207 electrically connected to a source or drain of the fourth MOSFET 205 for accumulating dark output therein, and a second capacitor 208 electrically connected to a source or drain of the fifth MOSFET 206 for accumulating bright output therein.

The first n+ semiconductor region 104 acts as a photoelectric transfer section for converting lights into electric charges. The first n+ semiconductor region 104 is electrically connected to a gate of the first MOSFET 202. The second n+ semiconductor region 105 acts as a drain of the control MOSFET 201.

The first, second and third MOSFETs 202, 203 and 204 are connected in series with one another between voltages VSS and VDD. One of sources and drains of the fifth and sixth MOSFETs 205 and 206 are electrically connected to a node located between the second and third MOSFETs 203 and 204, and the others are electrically connected both to the first and second capacitors 207 and 208, respectively, and output terminals.

The p+ semiconductor regions 103a and 103b are grounded. The second n+ semiconductor region 105 is in electrical connection with a source voltage VDD.

A plurality of such basic cells as illustrated in FIGS. 1 and 2 are arranged in a matrix to thereby define CMOS cell rows, as partially illustrated in FIG. 3A. Each of the basic cells 50 is electrically connected to vertical registers 51, a horizontal register 52, a load transistor 54, and an output line 53.

The load transistor 54 corresponds to the third load MOSFET 204 illustrated in FIGS. 1 and 2.

The output line 53 is electrically connected to the fourth and fifth MOSFETs 205 and 206, and the first and second capacitors 207 and 208 through MOSFET 55 acting as a vertical switch selected by the horizontal register 52.

FIG. 3B is a circuit diagram of CMOS sensor. Parts or elements that correspond to those in FIGS. 1 and 2 have been provided with the same reference numerals. A control pulse φR is applied to a gate of the control MOSFET 201. An address signal X is applied to a gate of the second MOSFET 203 acting as a horizontal selection switch. The load transistor 54 and the output line 53 are electrically connected to a source of the second MOSFET 203.

Hereinbelow is explained an operation of CMOS sensor illustrated in FIGS. 1, 2, 3A and 3B.

First, as illustrated in FIG. 2, the control pulse φR of the control MOSFET 201 is set equal to a high level voltage to thereby set the first n+ semiconductor region 104 equal to the source voltage VDD.

Then, as illustrated in FIG. 1, the control pulse φR of the control MOSFET 201 is set equal to a low level voltage for prevention of blooming.

The first n+ semiconductor region 104 acting as a photoelectric transfer section generates electrons and holes, based on lights incidents thereto. The thus generated electrons are accumulated in a depletion layer, and the thus generated holes are discharged through the p-type well 102.

In FIGS. 1 and 2, a hatched area having a deeper potential than the source voltage VDD is not depleted.

Then, a potential of the first n+ semiconductor region or photoelectric transfer section 104 is varied in accordance with the number of accumulated electrons. The variation in the potential of the first n+ semiconductor region or photoelectric transfer section 104 is output into the second MOSFET 203 acting as a horizontal selection switch through a source of the first MOSFET 202 acting as a source follower amplifier by virtue of source follower operation of the first MOSFET 202. Thus, there is obtained photoelectric transfer characteristics having superior linearity.

There is generated kTC noise caused by reset operation in the first n+ semiconductor region or photoelectric transfer section 104. However, such kTC noise can be removed by sampling and accumulating dark output generated prior to transfer of signal electric charges, and calculating a difference between bright output and the thus accumulated dark output.

In the above-mentioned solid-state image sensor having compatibility with CMOS fabrication process, a potential in the first n+ semiconductor region or photoelectric transfer section 104 varies in accordance with the accumulated electrons, and the variation in the potential is output into the second MOSFET or horizontal selection switch 203 through a source of the first MOSFET or source follower amplifier 202.

Herein, there is a relation among an amount Q of signal electric charges, a parasitic capacity C of the first n+ semiconductor region or photoelectric transfer section 104, and an output voltage V, as follows.

$V=Q/C$

FIG. 4 illustrates a relation between an amount of incident lights and a potential, and an output voltage.

In general, as illustrated in FIG. 4, an output voltage is in proportion to an amount of incident light or a potential. However, the solid-state image sensor having compatibility with CMOS fabrication process, as illustrated in FIGS. 1 and 2, is accompanied with a problem as follows. Since a photoelectric transfer section is formed of the first n+ semiconductor region 104, it is unavoidable for a parasitic capacity C of the photoelectric transfer section 104 to become high. As a result, it is not possible to produce high potential variation V caused by signal electric charges. This causes a problem of reduction in an output transfer efficiency.

There have been suggested many solid-state image sensors.

For instance, Japanese Unexamined Patent Publication No. 63-13582 has suggested a solid-state image sensor comprising a pixel array including pixel cells arranged in a matrix, each pixel cell having a photoelectric transfer device and a switching device for selecting a certain photoelectric transfer device, and a switching MOSFET receiving a vertical signal transmitted from the pixel array, and transmitting the received vertical signal to an output line. A bias voltage is applied to a well region where the pixel array is formed, in order to absorb false signals therein. A back bias voltage is applied to a well region of the switching MOSFET in order to reduce a junction capacity between the well region and a semiconductor region defining the switching MOSFET.

Japanese Unexamined Patent Publication No. 8-241982 has suggested a solid-state image sensor in which a p-type well and an n-type semiconductor layer are formed in a self-alignment manner to thereby make a region around the p-type well and the n-type semiconductor layer depleted. As a result, a parasitic capacity can be reduced in a region around the junction.

Japanese Unexamined Patent Publication No. 9-260628 has suggested a solid-state image sensor comprising an n-type semiconductor substrate, a p-type well region formed at a surface of the semiconductor substrate, heavily doped n-type regions formed in the vicinity of the p-type well region, and a lightly doped n-type region between and around the heavily doped n-type regions. A region around the heavily doped n-type regions, and the lightly doped n-type region are depleted by putting pn junction between the heavily doped n-type regions and the p-type well region in reverse-biased condition.

However, since a photoelectric transfer section is formed from a heavily doped n-type semiconductor region in all of the above-mentioned Japanese Unexamined Patent Publications. Hence, these Publications are also accompanied with such a problem as mentioned earlier that a great parasitic capacity of a photoelectric transfer section reduces an output transfer efficiency.

SUMMARY OF THE INVENTION

In view of the above-mentioned problem, it is an object of the present invention to provide a solid-state image sensor which is capable of reducing a parasitic capacity of a photoelectric transfer section to thereby enhance an output transfer efficiency and sensitivity.

There is provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a first region having a first electrical conductivity, extending to a gate electrode of the control transistor, and being in electrical connection with a gate electrode of the source follower transistor, and (b) a second region having a first electrical conductivity and formed adjacent to the first region.

It is preferable that a diffusion layer located opposite to the first region about the control transistor has the same electrical conductivity and the same impurity concentration as those of the first region.

It is preferable that the second region has a smaller impurity concentration than that of the first region.

It is preferable that the control transistor resets a potential of the photoelectric transfer section into a desired potential.

The first region may be designed to be in electrical connection with a gate electrode of the source follower transistor.

There is further provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a first region having a first electrical conductivity, extending to a gate electrode of the control transistor, and being in electrical connection with a gate electrode of the source follower transistor, (b) a second region having a first electrical conductivity and formed adjacent to the first region, and (c) a fourth region having a first electrical conductivity and formed adjacent to the first region.

It is preferable that the second and fourth regions are depleted by a high level voltage of the control transistor, and a depletion voltage level of the second region is deeper than a depletion voltage level of the fourth region.

The fourth region may be comprised of a plurality of sub-regions, in which case, it is preferable that the second region and the sub-regions of the fourth region are caused depleted by a high level voltage of the control transistor, a depletion voltage level of the second region is deeper than a depletion voltage level of the sub-regions of the fourth region, and a depletion voltage level in each one of the sub-regions of the fourth region, located closer to the first region is deeper.

The sub-regions of the fourth region may have almost the same impurity concentration. As an alternative, a sub-region of fourth region located closer to the third region may have a higher impurity concentration.

The first region may have almost the same impurity concentration as that of the fourth region.

There is still further provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a first region having a first electrical conductivity, extending to a gate electrode of the control transistor, and being in electrical connection with a gate electrode of the source follower transistor, (b) a second region having a first electrical conductivity and formed adjacent to the first region, (c) a fifth region having a first electrical conductivity and formed on the semiconductor layer and adjacent to the second region, and (d) a sixth region having a second electrical conductivity and formed on the fifth region.

The sixth region may be comprised of a plurality of sub-regions, in which case, it is preferable that the sub-regions of the sixth region have almost the same impurity concentration, or a sub-region of the sixth region located closer to the first region may have a higher impurity concentration.

There is yet further provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a third region having a first electrical conductivity, and being in electrical connection with a gate electrode of the source follower transistor, and (b) a first region having a first electrical conductivity and formed in the third region.

It is preferable that the first and third regions are not depleted by a high level voltage of the control transistor.

It is preferable that the third region has a smaller impurity concentration than that of the first region.

There is still yet further provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a third region having a first electrical conductivity, and being in electrical connection with a gate electrode of the source follower transistor, and (b) a first region having a first electrical conductivity and formed in the third region, and (c) a fourth region having a first electrical conductivity and formed adjacent to the third region.

It is preferable that the first region is surrounded entirely with the third region. As an alternative, the first region may be surrounded partially with the third region, and may be adjacent to the fourth region at a portion not surrounded by the third region.

It is preferable that the third and fourth regions have a smaller impurity concentration than that of the first region.

It is preferable that the fourth region has a smaller impurity concentration than that of the third region.

It is preferable that the first region has almost the same impurity concentration as that of the fourth region.

There is further provided a solid-state image sensor including (a) a semiconductor layer having a second electrical conductivity, (b) a photoelectric transfer section for converting a light into electric charges, formed on the semiconductor layer, (c) a control transistor formed above the semiconductor layer for controlling operation of the photoelectric transfer section, and (d) a source follower transistor for outputting therethrough a voltage caused by the electric charges, the photoelectric transfer section including (a) a third region having a first electrical conductivity, and being in electrical connection with a gate electrode of the source follower transistor, and (b) a first region having a first electrical conductivity and formed in the third region, (c) a fifth region having a first electrical conductivity and formed on the semiconductor layer and adjacent to the third region, and (d) a sixth region having a second electrical conductivity and formed on the fifth region.

As mentioned earlier, the sixth region may be comprised of a plurality of sub-regions.

In accordance with the present invention, a region of a photoelectric transfer section at which the photoelectric transfer section is electrically connected to a source follower transistor, and a region extending from the previously mentioned region to a control gate, is depleted by a high level potential of a control MOSFET. Hence, it is possible to reduce a parasitic capacity C of the photoelectric transfer section. As a result, a potential variation V caused by signal electric charges can be made greater, ensuring enhancement in an output transfer efficiency.

In addition, the present invention makes it possible to switch a signal-output characteristic relative to an amount of incident light among two, three or greater levels. This ensures a high dynamic range.

In some embodiments of the present invention, a semiconductor region which has a second electrical conductivity and is fixed at a ground voltage may be formed on a semiconductor region which has a first electrical conductivity and is depleted. Hence, a current generated at an interface between silicon and an oxide film can be eliminated by recombination, ensuring reduction in noises not caused by photoelectric transfer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 5:
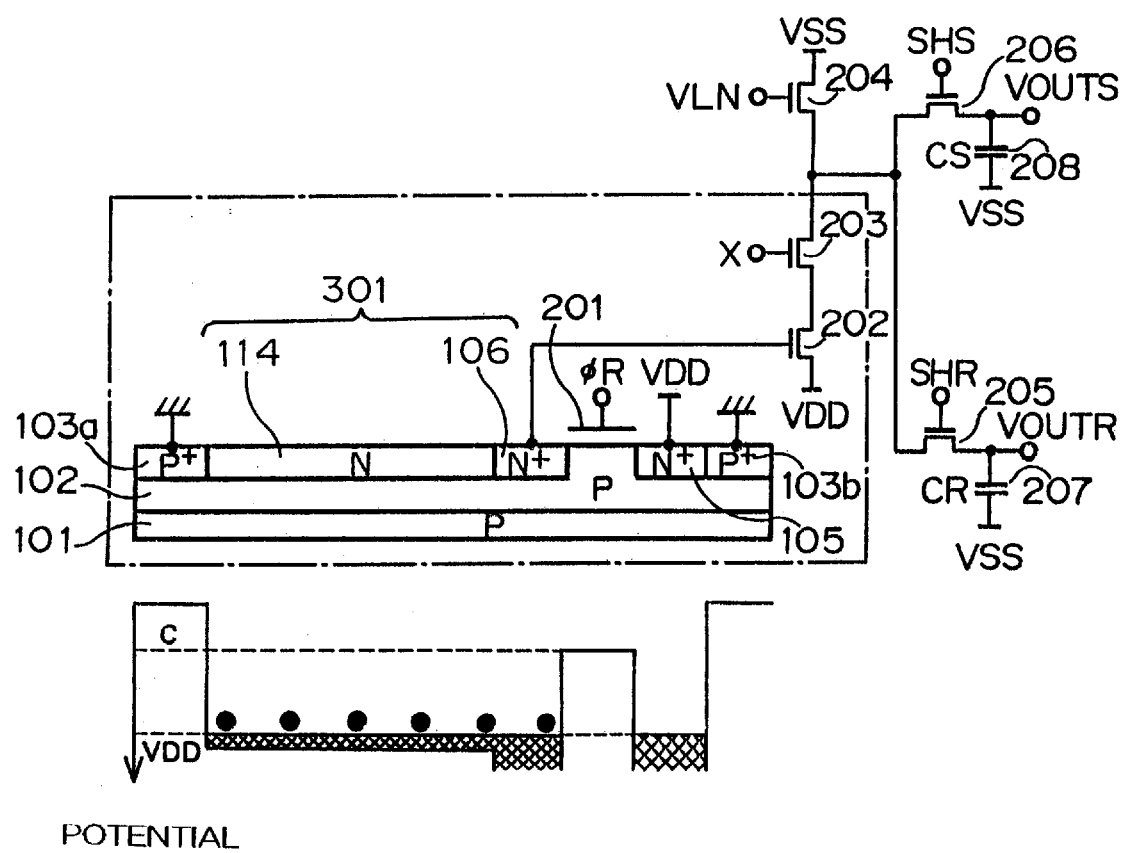
FIG. 5 is a cross-sectional view of a basic cell in CMOS sensor in accordance with the first embodiment of the present invention.

FIG. 5 illustrates a basic cell in CMOS sensor in accordance with the first embodiment. Parts or elements that correspond to those in FIG. 1 have been provided with the same reference numerals.

As illustrated in FIG. 5, a basic cell of CMOS sensor in accordance with the first embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a first region or n+ semiconductor region 106 sandwiched between the p-type well 102 and the p+ semiconductor region 103a, a second region or n-type semiconductor region 114 formed between the first region or n+ semiconductor region 106 and the p+ semiconductor region 103a, a n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The basic cell of CMOS sensor is electrically connected to an external circuit through the second MOSFET 203.

The external circuit is comprised of a third MOSFET 204 acting as a load of the source follower amplifier 202, a fourth MOSFET 205 for transferring dark output, a fifth MOSFET 206 for transferring bright output, a first capacitor 207 electrically connected to a source or drain of the fourth MOSFET 205 for accumulating dark output therein, and a second capacitor 208 electrically connected to a source or drain of the fifth MOSFET 206 for accumulating bright output therein.

The second MOSFET 203 is electrically connected to the third load MOSFET 204. The first region or n+ semiconductor region 106 is electrically connected to a gate of the first MOSFET 202. The n+ semiconductor region 105 acts as a drain of the control MOSFET 201.

The first, second and third MOSFETs 202, 203 and 204 are connected in series with one another between voltages VSS and VDD. One of sources and drains of the fifth and sixth MOSFETs 205 and 206 are electrically connected to a node located between the second and third MOSFETs 203 and 204, and the others are electrically connected both to the first and second capacitors 207 and 208, respectively, and output terminals.

As illustrated in FIG. 5, the first region or n+ semiconductor region 106 is formed on the p-type well layer 102, and has an end located just below an end of a gate of the control MOSFET 201.

The p+ semiconductor regions 103a and 103b are grounded. The n+ semiconductor region 105 is in electrical connection with a source voltage VDD.

Figure 1:
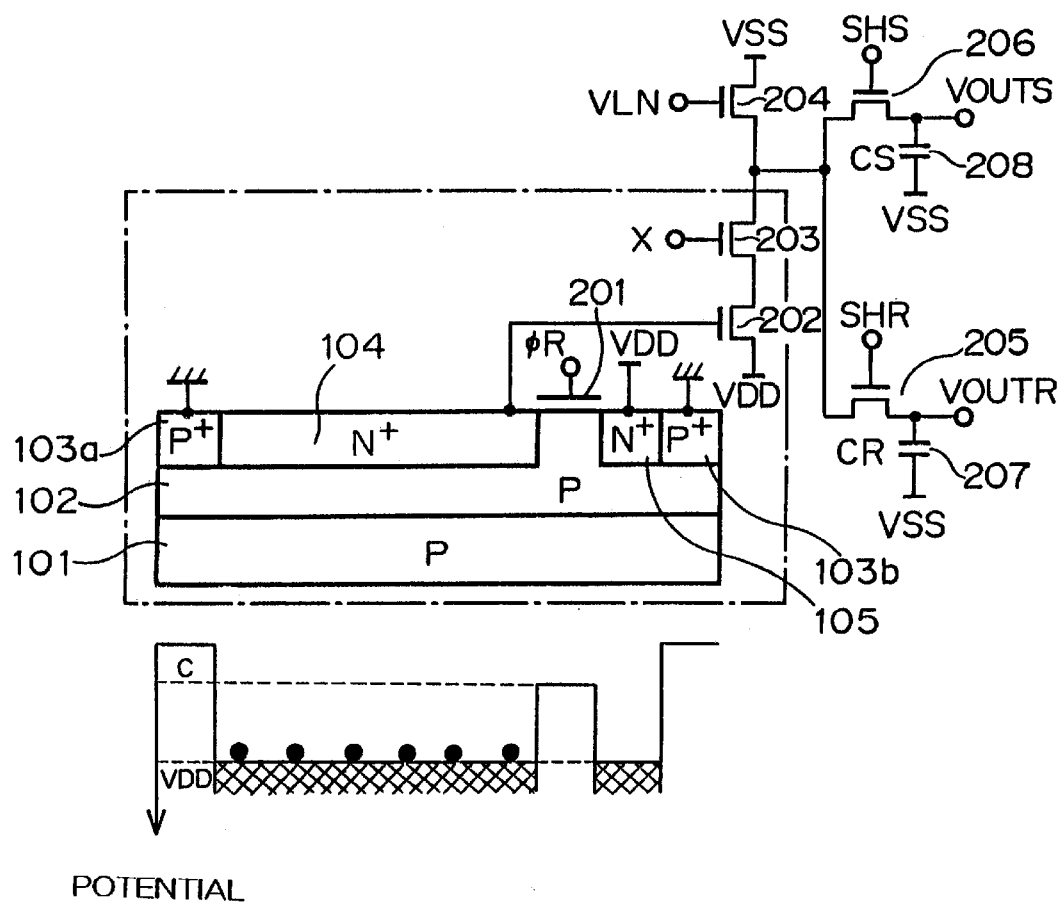
FIG. 1 is a cross-sectional view of a basic cell in a conventional CMOS sensor, and further illustrates a photoelectric transfer section in which signal electric charges are being accumulated in a photoelectric transfer section.
Figure 2:
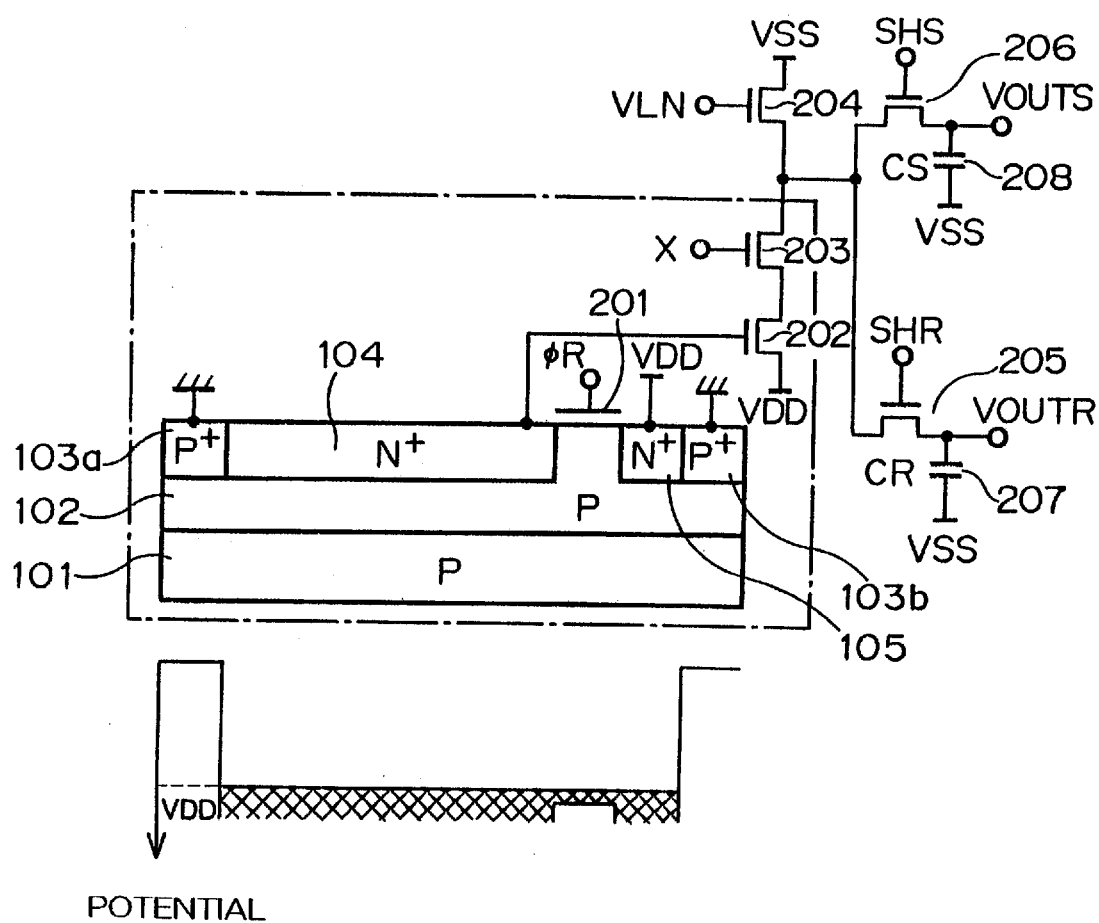
FIG. 2 is a cross-sectional view of a basic cell in a conventional CMOS sensor, and further illustrates a photoelectric transfer section in which signal electric charges in a photoelectric transfer section have been reset.
Figure 3A:
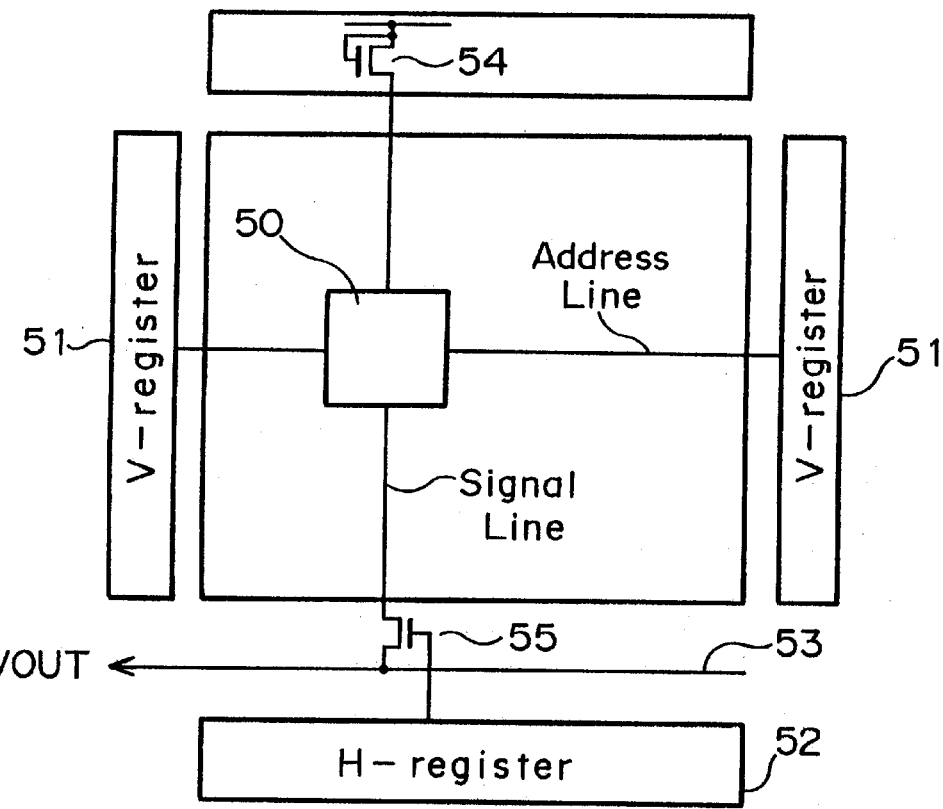
FIG. 3A is a block diagram of CMOS sensor illustrated in FIGS. 1 and 2.
Figure 3B:
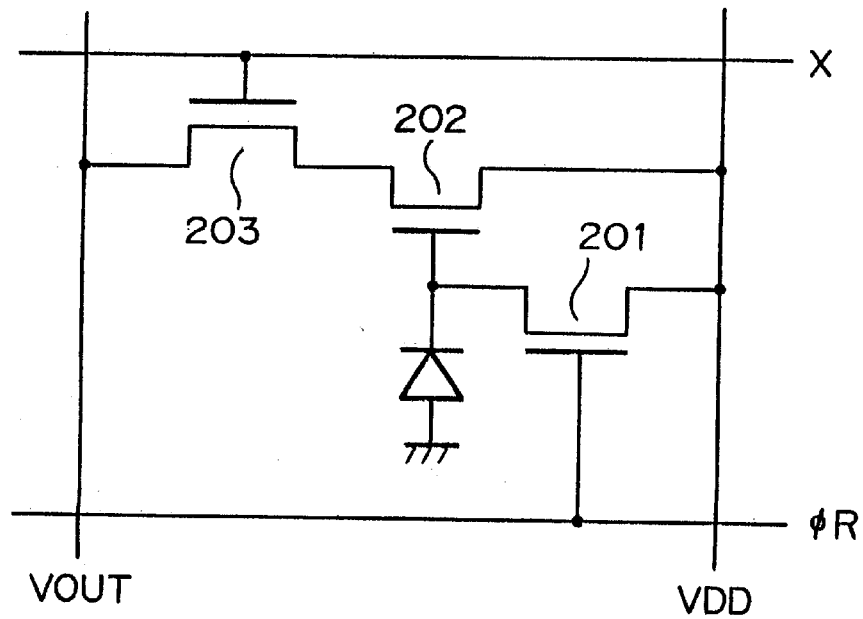
FIG. 3B is a circuit diagram of CMOS sensor illustrated in FIGS. 1 and 2.
Figure 4:
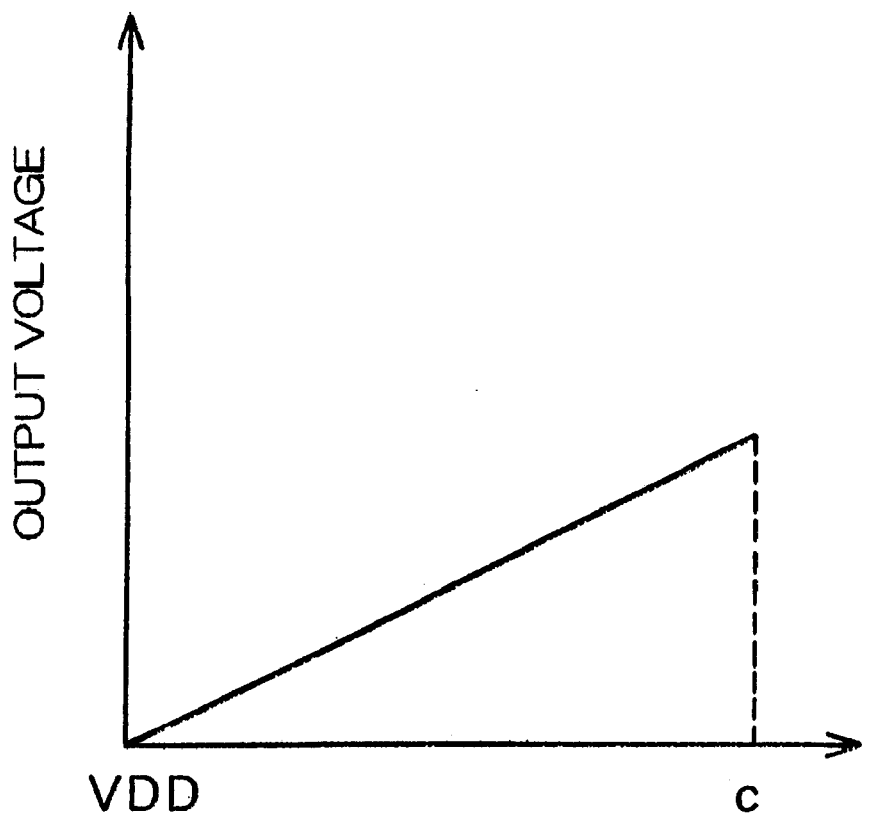
FIG. 4 is a graph showing a relation between an amount of incident lights and a potential, and an output voltage in a conventional CMOS sensor.

In comparison with the basic cell of the conventional CMOS sensor, illustrated in FIGS. 1 and 2, the basic cell of CMOS sensor in accordance with the first embodiment, illustrated in FIG. 5, is characterized in that a photoelectric transfer section 301 is comprised of the first region or n+ semiconductor region 106, and the second region or n-type semiconductor region 114.

The first region 106 is heavily doped with n-type impurities, whereas the second region 114 is lightly doped with n-type impurities.

Figure 6:
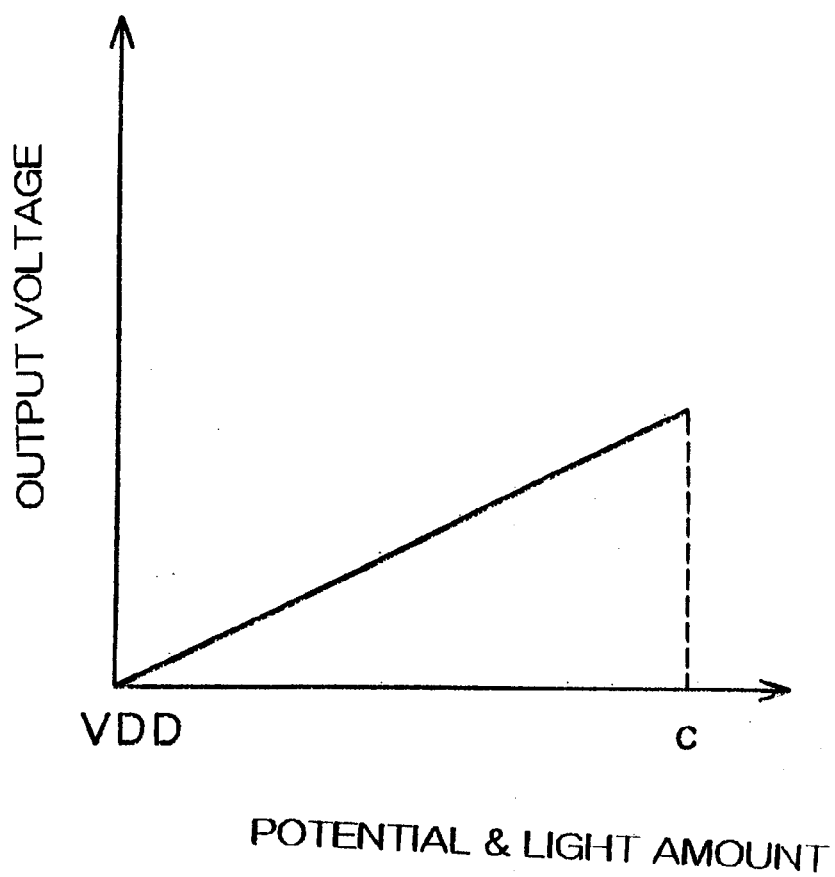
FIG. 6 is a graph showing a relation between an amount of incident lights and a potential, and an output voltage in CMOS sensor in accordance with the first embodiment.

A depletion layer is formed at a junction between the p-type well layer 102 and the p+ semiconductor region 103a, and the second region 114. In accordance with the first embodiment, it is possible to extend the depletion layer towards the photoelectric transfer section 301. Hence, as illustrated in FIG. 6, a parasitic capacity C of the photoelectric transfer section 301 can be reduced, which ensures great potential variation V caused by signal electric charges, and which further ensures enhancement in an output transfer efficiency.

Second Embodiment

Figure 7:
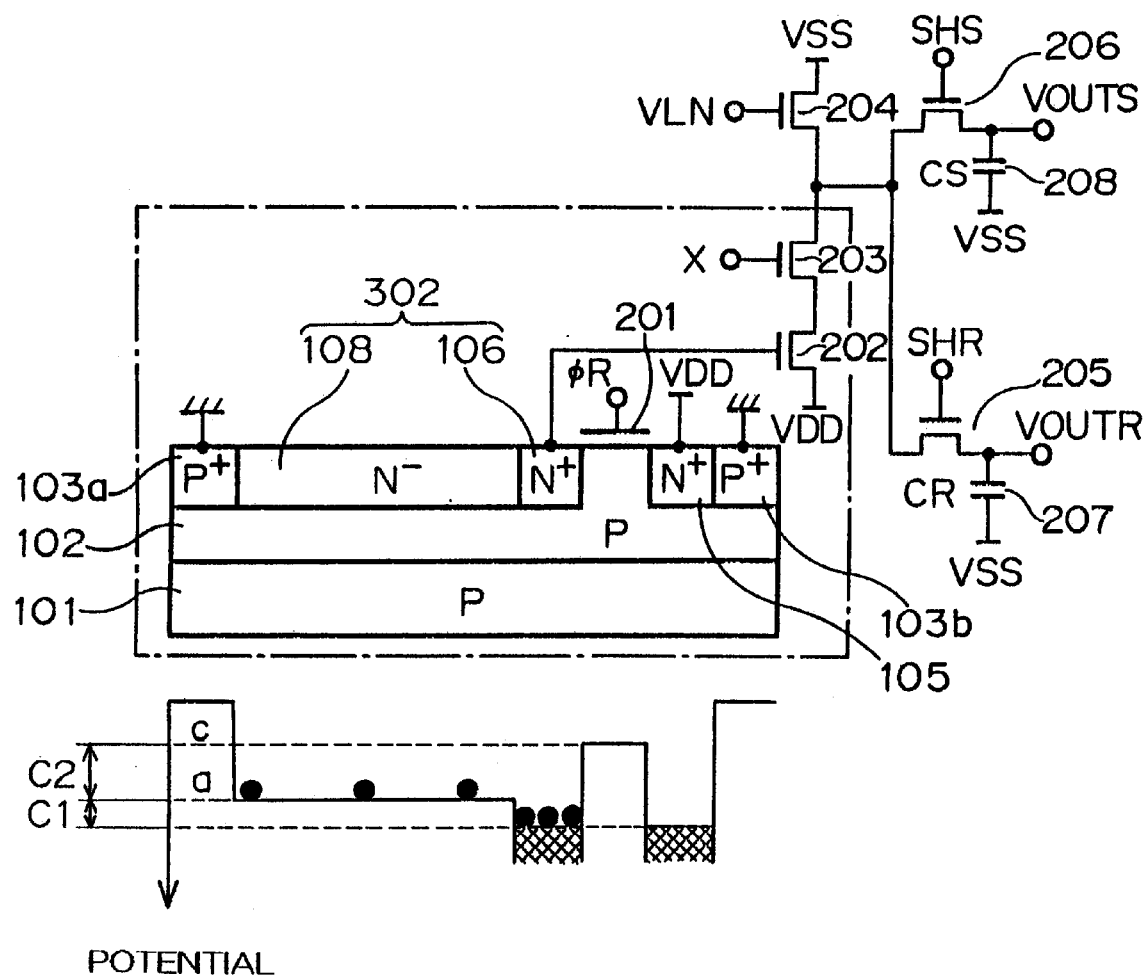
FIG. 7 is a cross-sectional view of a basic cell in CMOS sensor in accordance with the second embodiment of the present invention.

FIG. 7 illustrates a basic cell in CMOS sensor in accordance with the second embodiment. Parts or elements that correspond to those in FIG. 1 have been provided with the same reference numerals.

As illustrated in FIG. 7, a basic cell of CMOS sensor in accordance with the second embodiment is comprised of a p-type semiconductor substrate 101, a p-type well layer 102 formed in the semiconductor substrate 101 and partially exposed at a surface of the p-type semiconductor substrate 101, p+ semiconductor regions 103*a* and 103*b* exposed at a surface of the p-type semiconductor substrate 101, and isolating a region from adjacent regions in each of which a semiconductor device is fabricated, a first region or n+ semiconductor region 106 sandwiched between the p-type well 102 and the p+ semiconductor region 103*a*, a second region or n− semiconductor region 108 formed between the first region or n+ semiconductor region 106 and the p+ semiconductor region 103*a*, a n+ semiconductor region 105 sandwiched between the p-type well 102 and the p+ semiconductor region 103*b*, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The second embodiment is structurally different from the first embodiment illustrated in FIG. 5 only in that the second region is comprised of the n− semiconductor region 108 in place of the n-type semiconductor region 114.

That is, a photoelectric transfer section 302 in the second embodiment is comprised of the first region or n+ semiconductor region 106, and the second region or n− semiconductor region 108.

A depletion layer is formed at a junction between the p-type well layer 102 and the p+ semiconductor region 103*a*, and the second region 108. In accordance with the second embodiment, it is possible to extend the depletion layer towards the photoelectric transfer section 302. Hence, as illustrated in FIG. 7, a parasitic capacity C of the photoelectric transfer section 302 can be reduced, which ensures great potential variation V caused by signal electric charges, and which further ensures enhancement in an output transfer efficiency.

Though the second region 108 consisting of a lightly doped n-type semiconductor region is made depleted, the second region 108 cooperates with the first region 106 consisting of a heavily doped n-type semiconductor region to thereby define the photoelectric transfer section 302. Signal electric charges generated by photoelectric transfer are accumulated first in the first region 106 having a deeper potential, and secondly in the second region 108, as illustrated in a lower part of FIG. 7.

Figure 8:
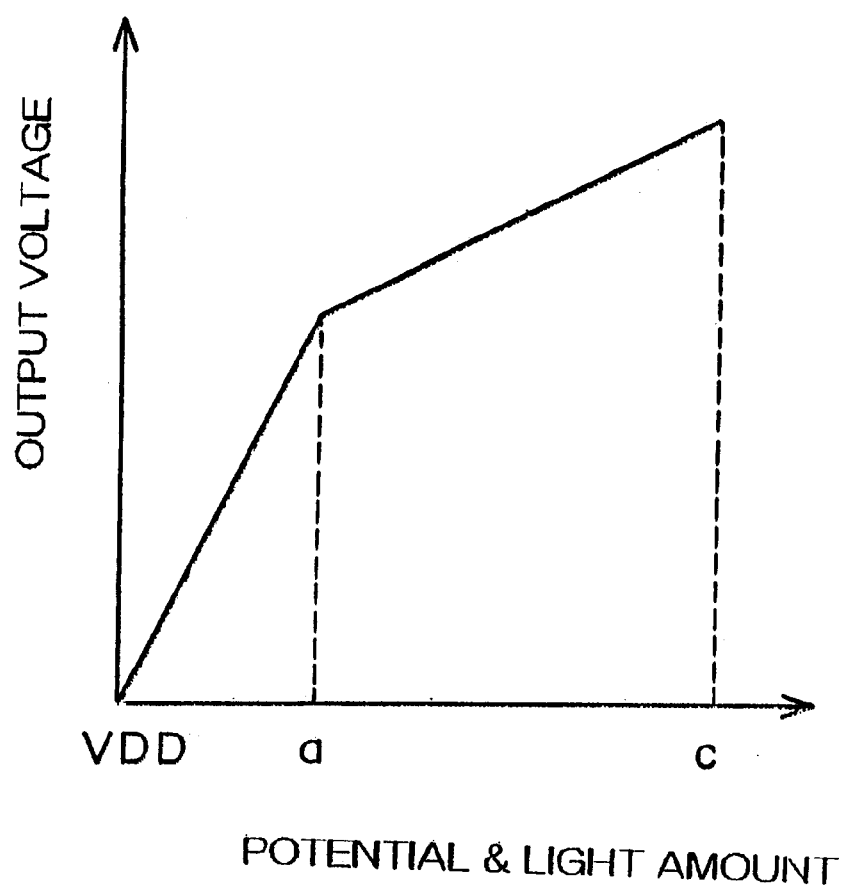
FIG. 8 is a graph showing a relation between an amount of incident lights and a potential, and an output voltage in CMOS sensor in accordance with the second embodiment.

In addition, a parasitic capacity C1 of the photoelectric transfer section 302, associated with a reset potential VDD, where signal electric charges are being accumulated in the first region 106, to a first potential "a" is smaller than a parasitic capacity C2 of the photoelectric transfer section 302, associated with the first potential "a" to a second potential "c" where signal electric charges are accumulated also in the second region 108. Hence, as illustrated in FIG. 8, there is obtained a two-stage characteristic between an amount of incident lights and an output voltage, ensuring a high dynamic range.

Third Embodiment

Figure 9:
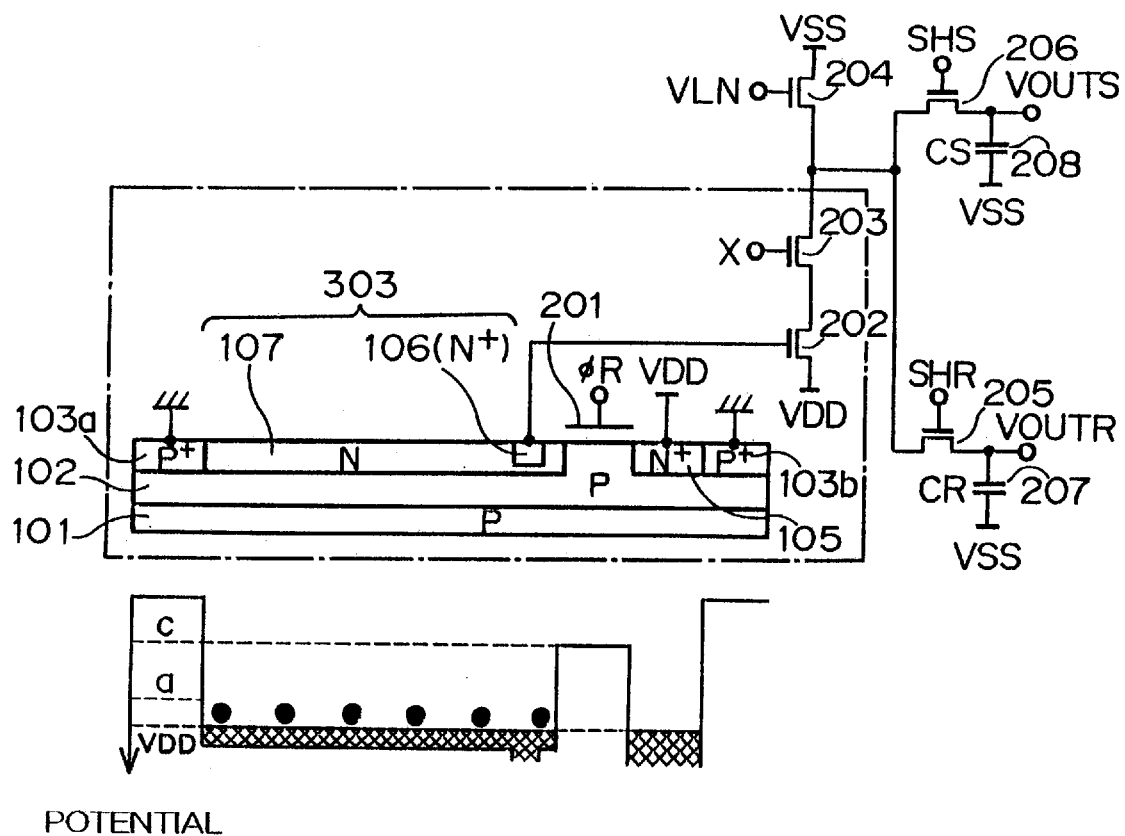
FIG. 9 is a cross-sectional view of a basic cell in CMOS sensor in accordance with the third embodiment of the present invention.

FIG. 9 illustrates a basic cell in CMOS sensor in accordance with the third embodiment. Parts or elements that correspond to those in FIG. 1 have been provided with the same reference numerals.

As illustrated in FIG. 9, a basic cell of CMOS sensor in accordance with the third embodiment is comprised of a p-type semiconductor substrate 101, a p-type well layer 102 formed in the semiconductor substrate 101 and partially exposed at a surface of the p-type semiconductor substrate 101, p+ semiconductor regions 103*a* and 103*b* exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103*a*, a first region or n+ semiconductor region 106 formed in the third region or n-type semiconductor region 107, a n+ semiconductor region 105 sandwiched between the p-type well 102 and the p+ semiconductor region 103*b*, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The third embodiment is structurally different from the first embodiment illustrated in FIG. 5 only in that the second region or n-type semiconductor region 114 is replaced with the third region or n-type semiconductor region 107.

As illustrated in FIG. 9, the third region or n-type semiconductor region 107 extends to a location just below a gate electrode of the control MOSFET 201. The first region 106 is formed in the third region 107. That is, the first region or n+ semiconductor region 106 is partially exposed at a surface of the p-type semiconductor substrate 101, but is completely surrounded by the third region or n-type semiconductor region 107 except a portion exposed at a surface of the p-type semiconductor substrate 101.

That is, a photoelectric transfer section 303 in the third embodiment is comprised of the first region or n+ semiconductor region 106, and the third region or n-type semiconductor region 107.

A depletion layer is formed at a junction between the p-type well layer 102 and the p+ semiconductor region 103*a*, and the third region 107. In accordance with the third embodiment, it is possible to extend the depletion layer towards the photoelectric transfer section 303. Hence, a parasitic capacity C of the photoelectric transfer section 303 can be reduced, which ensures great potential variation V caused by signal electric charges, and which further ensures enhancement in an output transfer efficiency.

Furthermore, CMOS sensor in accordance with the third embodiment can be fabricated in a smaller number of fabrication steps than a later mentioned CMOS sensor in accordance with the fifth embodiment.

Fourth Embodiment

Figure 10:
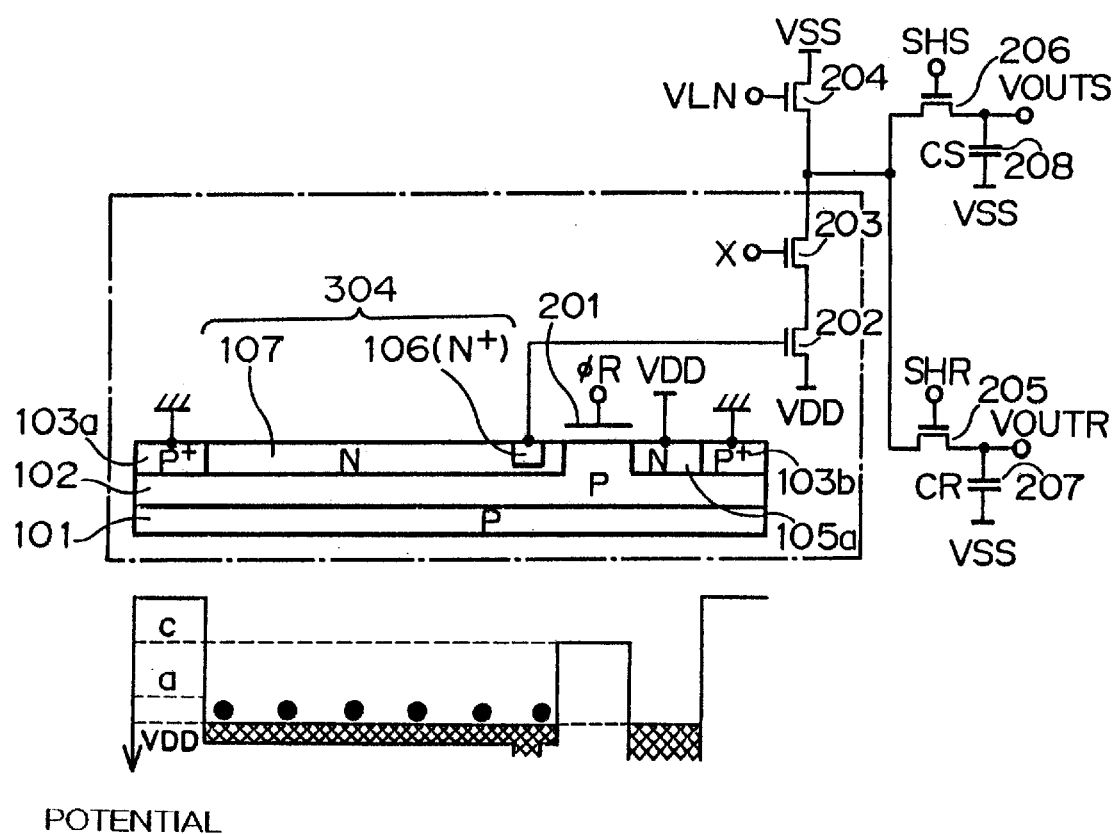
FIG. 10 is a cross-sectional view of a basic cell in CMOS sensor in accordance with the fourth embodiment of the present invention.

FIG. 10 illustrates a basic cell in CMOS sensor in accordance with the fourth embodiment. Parts or elements that correspond to those in FIG. 1 have been provided with the same reference numerals.

As illustrated in FIG. 10, a basic cell of CMOS sensor in accordance with the fourth embodiment is comprised of a p-type semiconductor substrate 101, a p-type well layer 102 formed in the semiconductor substrate 101 and partially exposed at a surface of the p-type semiconductor substrate 101, p+ semiconductor regions 103*a* and 103*b* exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, an semiconductor region 105a sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The fourth embodiment is structurally different from the third embodiment illustrated in FIG. 9 only in that the n+ semiconductor region 105 acting as a drain of the control MOSFET 201 is replaced with the n-type semiconductor region 105a.

In accordance with the fourth embodiment, it is also possible to extend the depletion layer towards the photoelectric transfer section 303, similarly to the third embodiment. Hence, a parasitic capacity C of the photoelectric transfer section 303 can be reduced, which ensures great potential variation V caused by signal electric charges, and which further ensures enhancement in an output transfer efficiency.

Furthermore, CMOS sensor in accordance with the fourth embodiment can be fabricated in a smaller number of fabrication steps than a later mentioned CMOS sensor in accordance with the fifth embodiment.

Fifth Embodiment

Figure 11:
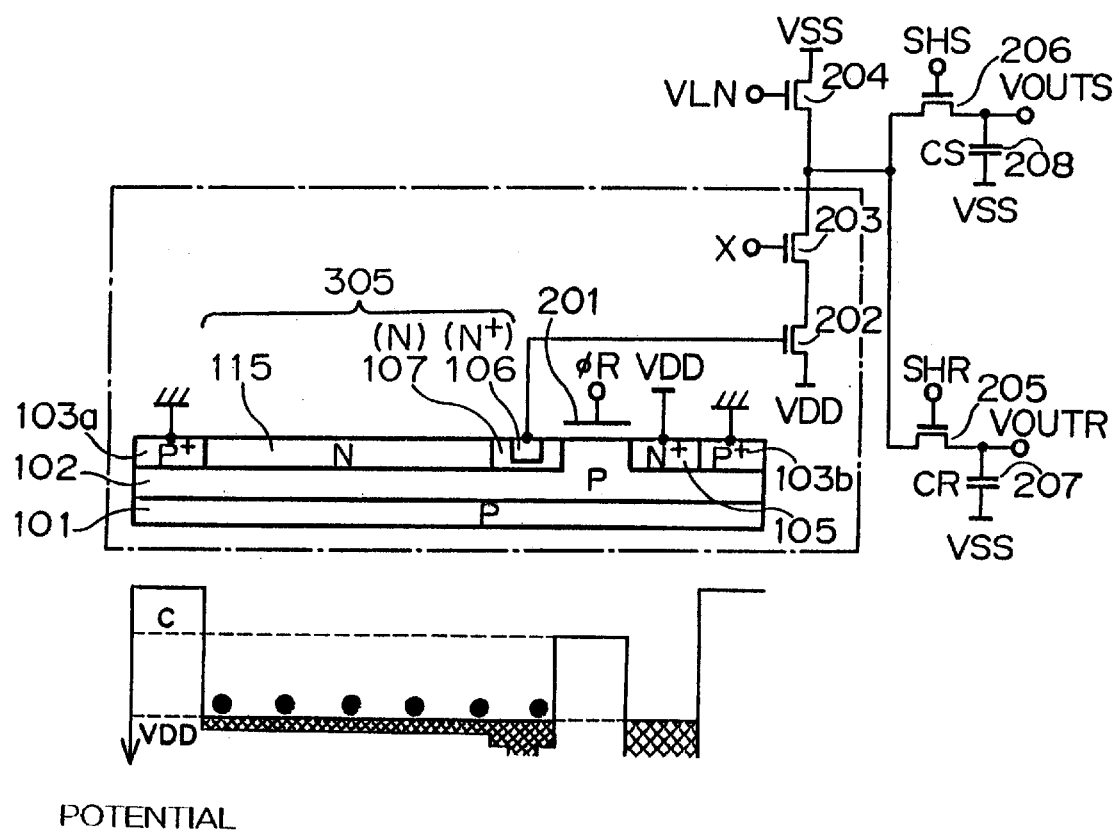
FIG. 11 is a cross-sectional view of a basic cell in CMOS sensor in accordance with the fifth embodiment of the present invention.

FIG. 11 illustrates a basic cell in CMOS sensor in accordance with the fifth embodiment. Parts or elements that correspond to those in FIG. 1 have been provided with the same reference numerals.

As illustrated in FIG. 11, a basic cell of CMOS sensor in accordance with the fifth embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, a fourth region or n-type semiconductor region 115 formed on the p-type well layer 102 and sandwiched between the p+ semiconductor region 103a and the third region or n-type semiconductor region 107, a n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The fifth embodiment is structurally different from the third embodiment illustrated in FIG. 9 only in that CMOS sensor further includes the fourth region or n-type semiconductor region 115.

As illustrated in FIG. 11, the fourth region or n-type semiconductor region 115 is formed on the p-type well layer 102 and sandwiched between the p+ semiconductor region 103a and the third region 107. That is, the fourth region or n-type semiconductor region 115 is formed in a vacant region formed by fabricating the third region or n-type semiconductor region 107 in the third embodiment in a shorter length than a length of the third region illustrated in FIG.

A photoelectric transfer section 305 in the fifth embodiment is comprised of the first region or n+ semiconductor region 106, the third region or n-type semiconductor region 107, and the fourth region or n-type semiconductor region 115.

A depletion layer is formed at a junction between the p-type well layer 102 and the p+ semiconductor region 103a, and the third and fourth regions 107 and 115. In accordance with the fifth embodiment, since the third region or n-type semiconductor region 107 including n-type impurity at a lower concentration than the first region or n+ semiconductor region 106 is formed between the p-type well layer 102 and the p+ semiconductor region 103a, it is possible to extend the depletion layer towards the photoelectric transfer section 305. Hence, a parasitic capacity C of the photoelectric transfer section 305 can be reduced, which ensures great potential variation V caused by signal electric charges, and which further ensures enhancement in an output transfer efficiency.

Sixth Embodiment

Figure 12:
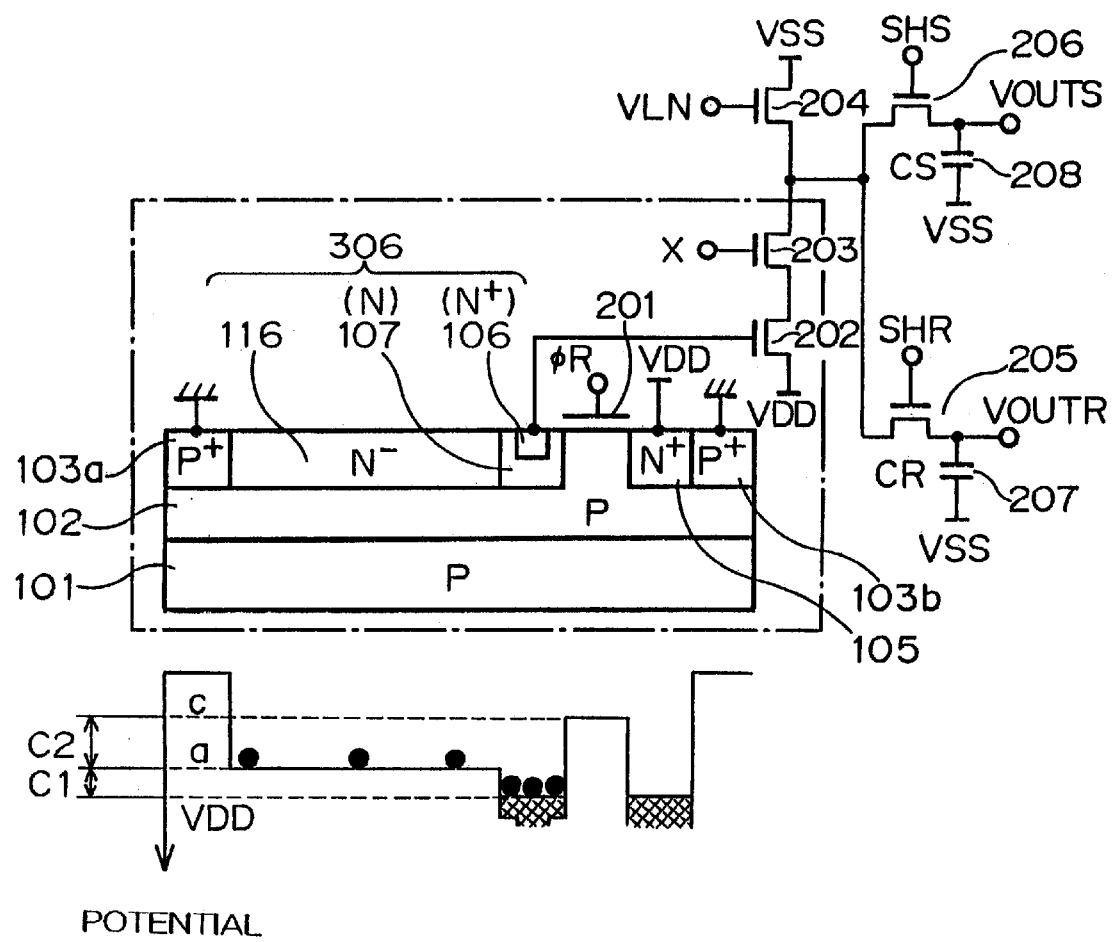
FIG. 12 is a cross-sectional view of a basic cell in CMOS sensor in accordance with the sixth embodiment of the present invention.

FIG. 12 illustrates a basic cell in CMOS sensor in accordance with the sixth embodiment. Parts or elements that correspond to those in FIG. 1 have been provided with the same reference numerals.

As illustrated in FIG. 12, a basic cell of CMOS sensor in accordance with the sixth embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, a fourth region or n− semiconductor region 116 formed on the p-type well layer 102 and sandwiched between the p+ semiconductor region 103a and the third region or n-type semiconductor region 107, a n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The sixth embodiment is structurally different from the fifth embodiment illustrated in FIG. 11 only in that the fourth region is comprised of the n− semiconductor region 116 in place of the n-type semiconductor region 115.

A photoelectric transfer section 306 in the sixth embodiment is comprised of the first region or n+ semiconductor region 106, the third region or n-type semiconductor region 107, and the fourth region or n− semiconductor region 116.

A depletion layer is formed at a junction between the p-type well layer 102 and the p+ semiconductor region 103a, and the third and fourth regions 107 and 116. In accordance with the sixth embodiment, since the third region or n-type semiconductor region 107 including n-type impurity at a lower concentration than the first region or n+ semiconductor region 106 is formed between the p-type well layer 102 and the p+ semiconductor region 103a, it is possible to extend the depletion layer towards the photoelectric transfer section 306. Hence, a parasitic capacity C of the photoelectric transfer section 306 can be reduced, which ensures great potential variation V caused by signal electric charges, and which further ensures enhancement in an output transfer efficiency.

Though the fourth region 116 consisting of a lightly doped n-type semiconductor region is made depleted, similarly to the second embodiment, the fourth region 116 cooperates with the first region 106 and the third region 107 to thereby define the photoelectric transfer section 306. Signal electric charges generated by photoelectric transfer are accumulated first in the first region 106 having a deeper potential, and secondly in the third region 107, as illustrated in a lower part of FIG. 12.

In addition, similarly to the second embodiment, a parasitic capacity C1 of the photoelectric transfer section 306, associated with a reset potential VDD, where signal electric charges are being accumulated in the first region 106, to a first potential "a" is smaller than a parasitic capacity C2 of the photoelectric transfer section 306, associated with the first potential "a" to a second potential "c" where signal electric charges are accumulated also in the fourth region 116. Hence, as illustrated in FIG. 8, there is obtained a two-stage characteristic between an amount of incident lights and an output voltage, ensuring a high dynamic range.

In the fifth and sixth embodiments illustrated in FIGS. 11 and 12, respectively, the first region or n+ semiconductor region 106 is entirely surrounded with the third region or n-type semiconductor region 107. It should be noted that it is not always necessary to form the first region 106 in such a manner as illustrated in FIGS. 11 and 12.

Figure 13:
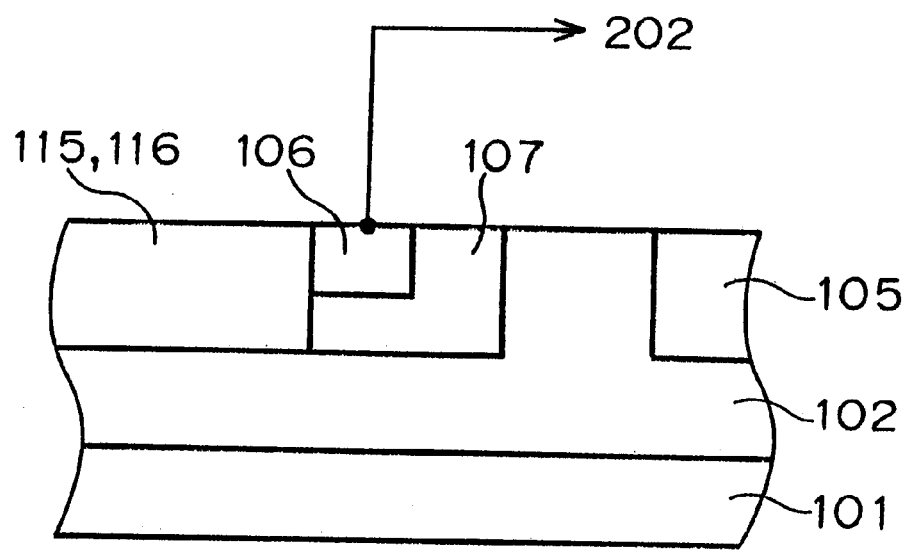
FIG. 13 is a partial cross-sectional view of a variant of a basic cell in CMOS sensor in accordance with the sixth embodiment of the present invention.

FIG. 13 illustrates a variant of the first region or n+ semiconductor region 106. As illustrated in FIG. 13, the first region or n+ semiconductor region 106 may be partially surrounded by the third region or n-type semiconductor region 107, and be adjacent to the fourth region 115 or 116 at a portion not surrounded by the third region 107.

Seventh Embodiment

Figure 14:
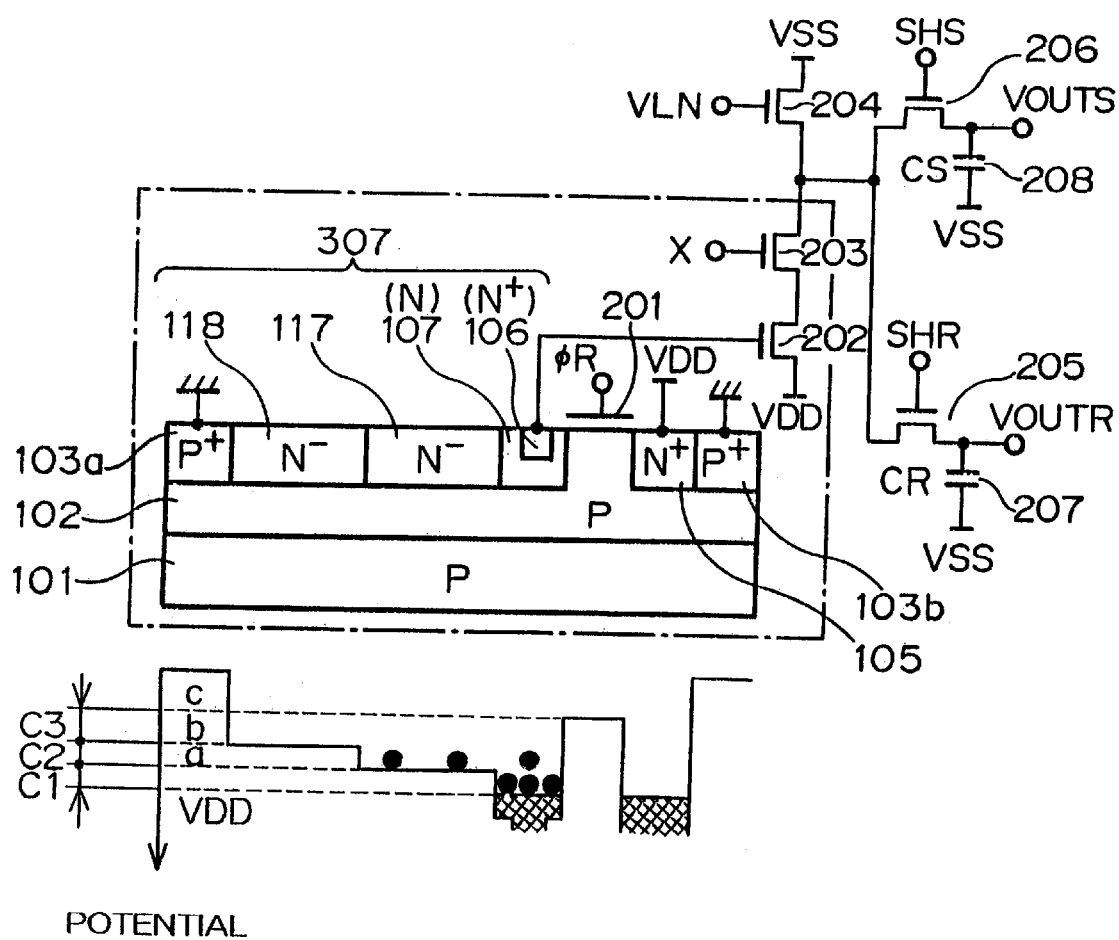
FIG. 14 is a cross-sectional view of a basic cell in CMOS sensor in accordance with the seventh embodiment of the present invention.

FIG. 14 illustrates a basic cell in CMOS sensor in accordance with the seventh embodiment. Parts or elements that correspond to those in FIG. 1 have been provided with the same reference numerals.

As illustrated in FIG. 14, a basic cell of CMOS sensor in accordance with the seventh embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, a fourth region or n− semiconductor region comprising a plurality of sub-regions 117 and 118, formed on the p-type well layer 102, and sandwiched between the p+ semiconductor region 103a and the third region or n-type semiconductor region 107, a n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The seventh embodiment is structurally different from the sixth embodiment illustrated in FIG. 12 only in that CMOS sensor includes a plurality of sub-regions constituting the fourth region, in place of the single fourth region or n− semiconductor region 116.

That is, the fourth region in the seventh embodiment is comprised of a first sub-region 117 consisting of an n− semiconductor region and a second subregion 118 consisting of an n− semiconductor region. The first sub-region 117 is formed adjacent to the third region 107, and the second sub-region 118 is formed adjacent to the first sub-region 117.

The first sub-region or n− semiconductor region 117 is made depleted by a high level potential of the control MOSFET 201.

The second sub-region 118 is designed to contain an n-type impurity at a lower concentration than that of the first sub-region 117.

A photoelectric transfer section 307 in the seventh embodiment is comprised of the first region or n+ semiconductor region 106, the third region or n-type semiconductor region 107, the first sub-region or n− semiconductor region 117, and the second sub-region or n− semiconductor region 118.

A depletion layer is formed at a junction between the p-type well layer 102 and the p+ semiconductor region 103a, and the second sub-region or n− semiconductor region 118. In accordance with the seventh embodiment, it is possible to extend the depletion layer towards the photoelectric transfer section 307. Hence, a parasitic capacity C of the photoelectric transfer section 307 can be reduced, which ensures great potential variation V caused by signal electric charges, and which further ensures enhancement in an output transfer efficiency.

Though the first and second sub-regions 117 and 118 constituting the fourth region are made depleted, similarly to the second and sixth embodiments, the first and second sub-regions 117 and 118 cooperate with the first region 106 and the third region 107 to thereby define the photoelectric transfer section 307. Signal electric charges generated by photoelectric transfer are accumulated first in the first region 106 having a deeper potential, and secondly in the third region 107, as illustrated in a lower part of FIG. 14.

Figure 15:
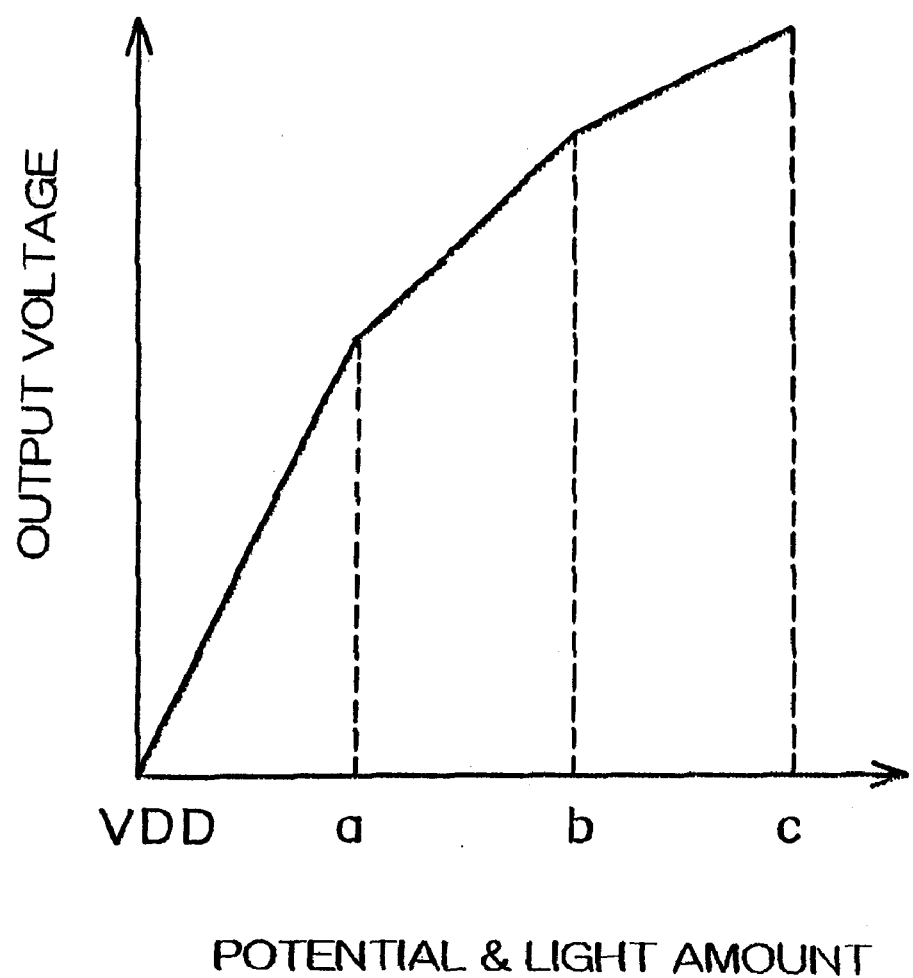
FIG. 15 is a graph showing a relation between an amount of incident lights and a potential, and an output voltage in CMOS sensor in accordance with the seventh embodiment.

In addition, similarly to the second embodiment, a parasitic capacity C1 of the photoelectric transfer section 307, associated with a reset potential VDD, where signal electric charges are being accumulated in the first region 106, to a first potential "a" is smaller than a parasitic capacity C2 of the photoelectric transfer section 307, associated with the first potential "a" to a second potential "b" where signal electric charges are accumulated in the first sub-region 117. Furthermore, the parasitic capacity C2 is smaller than a parasitic capacity C3 of the photoelectric transfer section 307, associated with the second potential "b" to a third potential "c" where signal electric charges are accumulated in the second sub-region 118. Hence, as illustrated in FIG. 15, there is obtained a three-stage characteristic between an amount of incident lights and an output voltage, ensuring a high dynamic range.

In the seventh embodiment, the fourth region is designed to include two sub-regions 117 and 118. However, the number of sub-regions constituting the fourth region is not to be limited to two. The fourth region may be designed to be comprised of three or more sub-regions, in which case, it is preferable that a subregion located closer to the third region 107 contains an impurity at a higher concentration.

The first and second sub-regions 117 and 118 in the seventh embodiment may be formed in CMOS sensor in accordance with the first embodiment, illustrated in FIG. 5. When the first and second sub-regions 117 and 118 are applied to CMOS sensor in accordance with the first embodiment, the first and second sub-regions 117 and 118 are formed between the p+ semiconductor region 103a and the second region or n-type semiconductor region 114.

Eighth Embodiment

Figure 16:
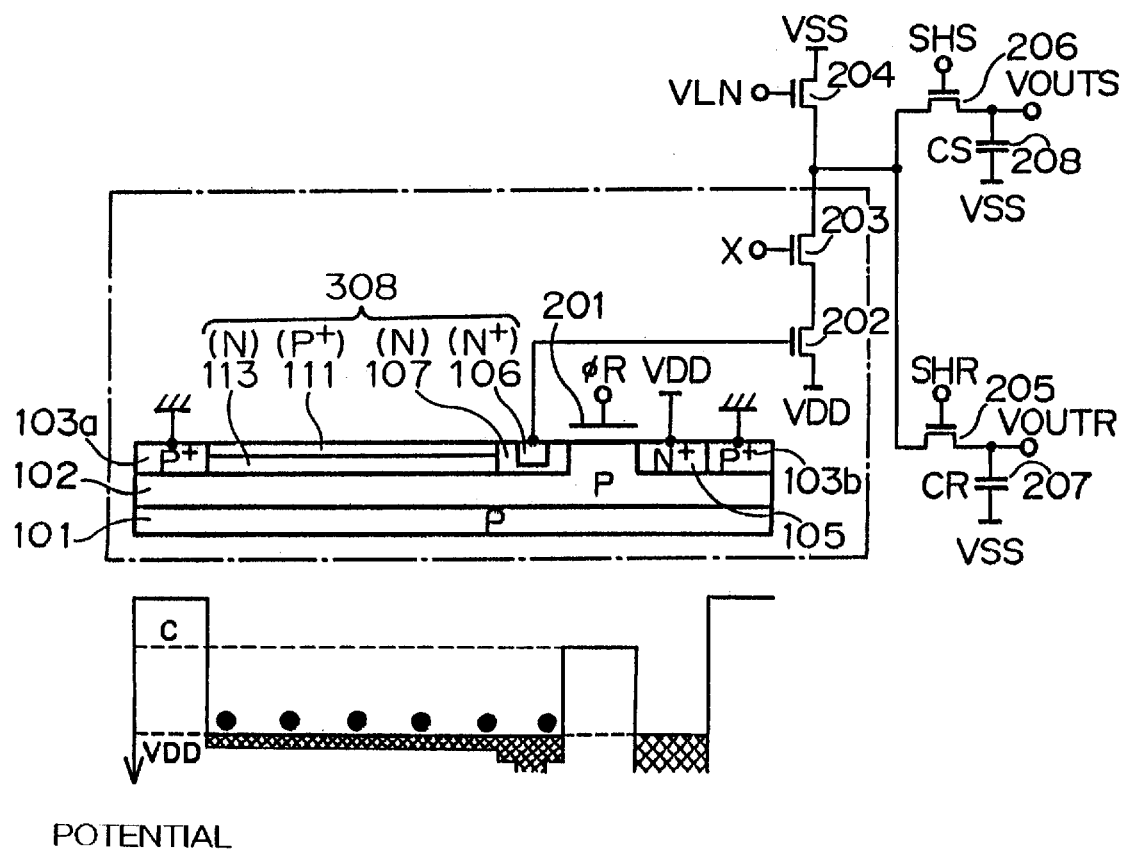
FIG. 16 is a cross-sectional view of a basic cell in CMOS sensor in accordance with the eighth embodiment of the present invention.

FIG. 16 illustrates a basic cell in CMOS sensor in accordance with the eighth embodiment. Parts or elements that correspond to those in FIG. 1 have been provided with the same reference numerals.

As illustrated in FIG. 16, a basic cell of CMOS sensor in accordance with the eighth embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, a fifth region or n-type semiconductor region 113 formed on the p-type well layer 102 and sandwiched between the p+ semiconductor region 103a and the third region or n-type semiconductor region 107, a sixth region or p+ semiconductor region 111 formed on the fifth region or n-type semiconductor region 113, an n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The eighth embodiment is structurally different from the fifth embodiment illustrated in FIG. 11 only in that. CMOS sensor includes the fifth region or n-type semiconductor region 113 and the sixth region or p+ semiconductor region 111 in place of the fourth region or n-type semiconductor region 115.

A ground voltage (GND) is applied to the sixth region or p+ semiconductor region 111.

A photoelectric transfer section 308 in the eighth embodiment is comprised of the first region or n+ semiconductor region 106, the third region or n-type semiconductor region 107, the fifth region or n-type semiconductor region 113, and the sixth region or p+ semiconductor region 111.

A depletion layer is formed at a junction between the p-type well layer 102 and the p+ semiconductor region 103a, and the fifth and sixth regions 113 and 111. In accordance with the eighth embodiment, it is possible to extend the depletion layer towards the photoelectric transfer section 308. Hence, a parasitic capacity C of the photoelectric transfer section 308 can be reduced, which ensures great potential variation V caused by signal electric charges, and which further ensures enhancement in an output transfer efficiency.

The fifth and sixth regions 113 and 111 in the eighth embodiment may be formed in CMOS sensor in accordance with the first embodiment, illustrated in FIG. 5. When the fifth and sixth regions 113 and 111 are applied to CMOS sensor in accordance with the first embodiment, the filth and sixth regions 113 and 111 are formed between the p+ semiconductor region 103a and the second region or n-type semiconductor region 114.

Ninth Embodiment

Figure 17:
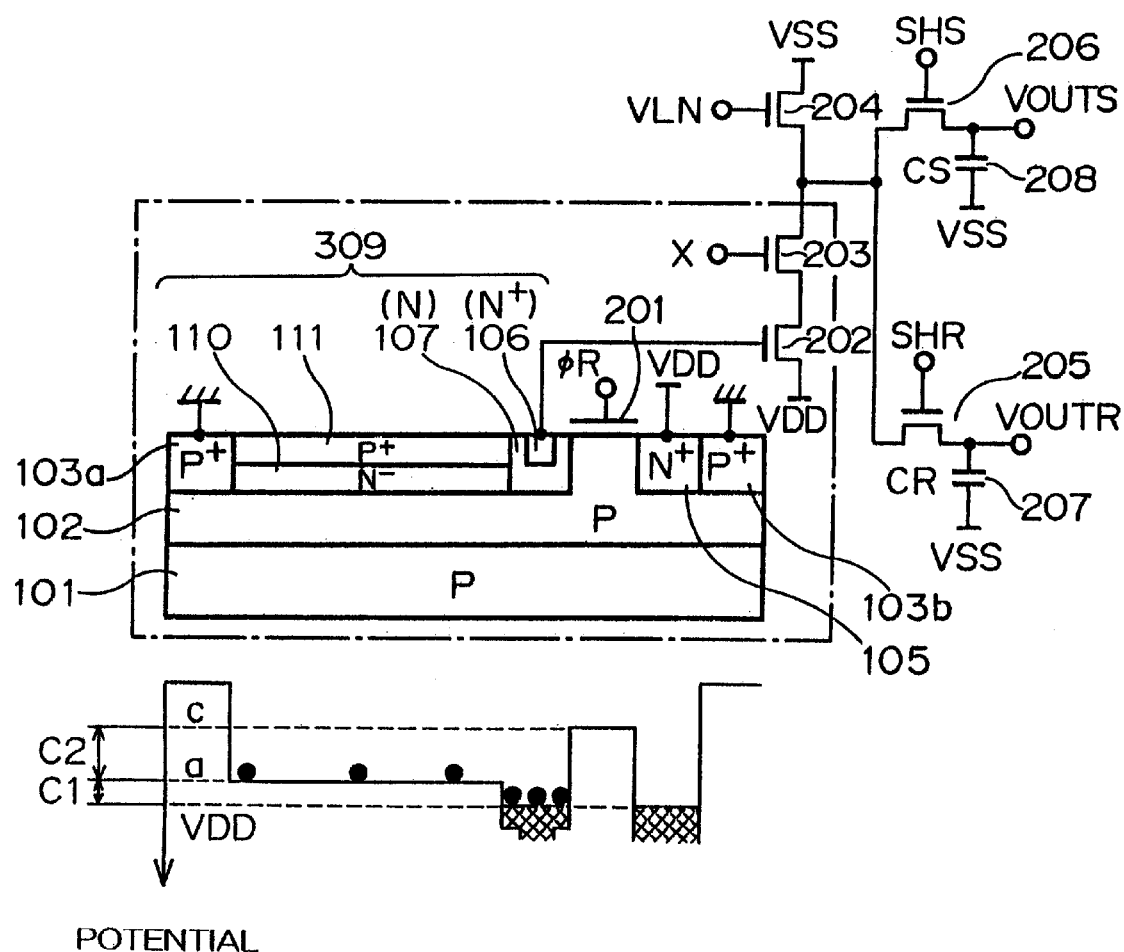
FIG. 17 is a cross-sectional view of a basic cell in CMOS sensor in accordance with the ninth embodiment of the present invention.

FIG. 17 illustrates a basic cell in CMOS sensor in accordance with the ninth embodiment. Parts or elements that correspond to those in FIG. 1 have been provided with the same reference numerals.

As illustrated in FIG. 17, a basic cell of CMOS sensor in accordance with the ninth embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, a fifth region or n− semiconductor region 110 formed on the p-type well layer 102 and sandwiched between the p+ semiconductor region 103a and the third region or n-type semiconductor region 107, a sixth region or p+ semiconductor region 111 formed on the fifth region or n− semiconductor region 110, a n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The ninth embodiment is structurally different from the eighth embodiment illustrated in FIG. 16 only in that the fifth region is comprised of the n− semiconductor region 110 in place of the n-type semiconductor region 113.

A photoelectric transfer section 309 in the ninth embodiment is comprised of the first region or n+ semiconductor region 106, the third region or n-type semiconductor region 107, the fifth region or n− semiconductor region 110, and the sixth region or p+ semiconductor region 111.

The fifth region or n− semiconductor region 110 is made depleted by a high level potential of the control MOSFET 201.

A depletion layer is formed at a junction between the p-type well layer 102 and the p+ semiconductor region 103a, and the fifth and sixth regions 110 and 111. In accordance with the ninth embodiment, it is possible to extend the depletion layer towards the photoelectric transfer section 309. Hence, a parasitic capacity C of the photoelectric transfer section 309 can be reduced, which ensures great potential variation V caused by signal electric charges, and which further ensures enhancement in an output transfer efficiency.

Though the fifth region or n− semiconductor region 110 is made depleted, similarly to the second, sixth and seventh embodiments, the fifth region or n− semiconductor region 110 cooperate with the first region 106 and the third region 107 to thereby define the photoelectric transfer section 309. Signal electric charges generated by photoelectric transfer are accumulated first in the first region 106 having a deeper potential, and secondly in the third region 107, as illustrated in a lower part of FIG. 17.

In addition, similarly to the sixth embodiment, a parasitic capacity C1 of the photoelectric transfer section 309, associated with a reset potential VDD, where signal electric charges are being accumulated in the first region 106, to a first potential "a" is smaller than a parasitic capacity C2 of the photoelectric transfer section 309, associated with the first potential "a" to a second potential "c" where signal electric charges are accumulated also in the fifth region 110. Hence, as illustrated in FIG. 8, there is obtained a two-stage characteristic between an amount of incident lights and an output voltage, ensuring a high dynamic range.

In addition, in the ninth embodiment, since the sixth region 111 consisting of a heavily doped p-type semiconductor region and fixed at the ground voltage is formed on the fifth region 110 consisting of a lightly doped n-type semiconductor region and caused depleted, a current generated at an interface between silicon and an oxide film can be eliminated by recombination, ensuring reduction in noises not caused by photoelectric transfer.

The fifth and sixth regions 110 and 111 in the eighth embodiment may be formed in CMOS sensor in accordance with the first embodiment, illustrated in FIG. 5. When the fifth and sixth regions 110 and 111 are applied to CMOS sensor in accordance with the first embodiment, the fifth and sixth regions 110 and 111 are formed between the p+ semiconductor region 103a and the second region or n-type semiconductor region 114.

Tenth Embodiment

Figure 18:
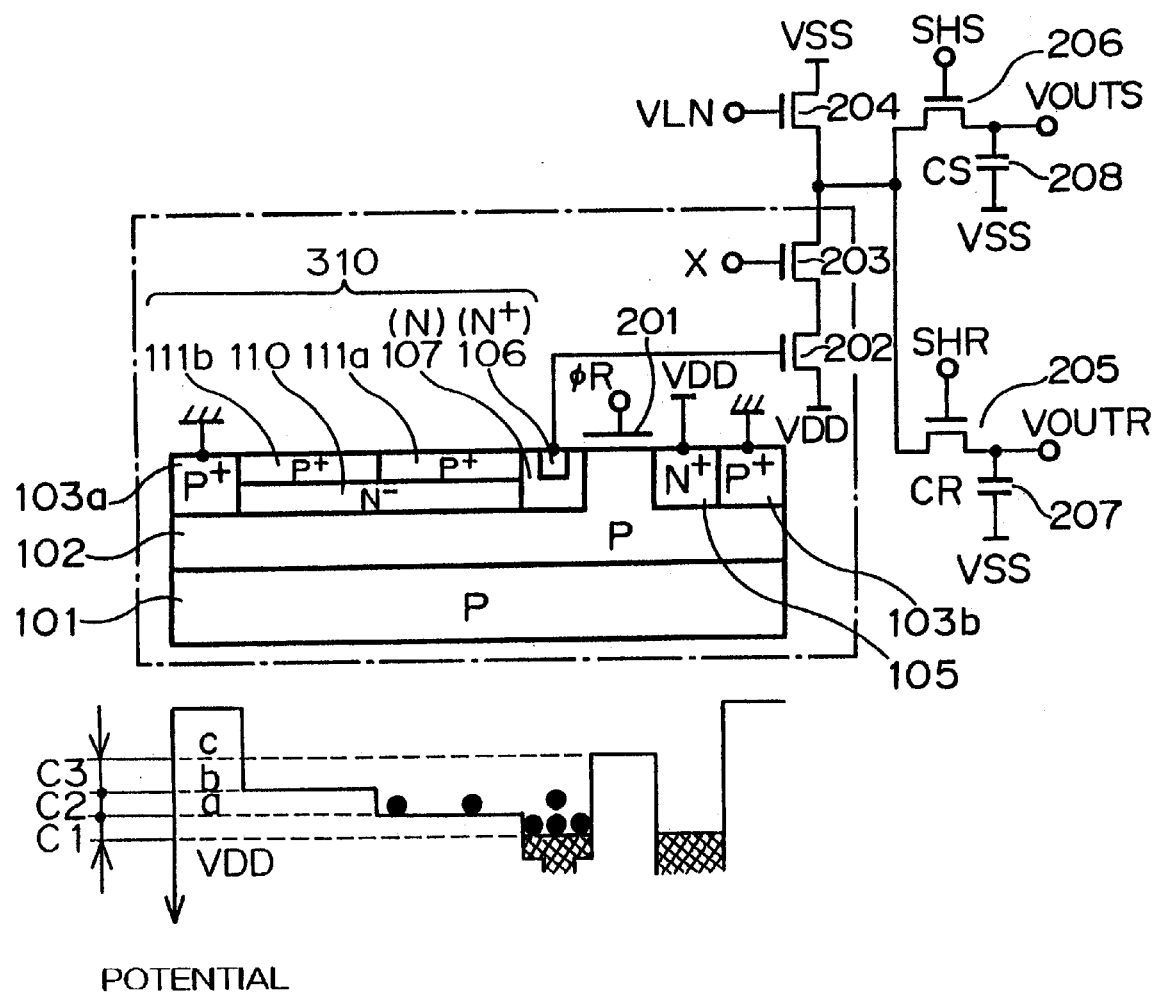
FIG. 18 is a cross-sectional view of a basic cell in CMOS sensor in accordance with the tenth embodiment of the present invention.

FIG. 18 illustrates a basic cell in CMOS sensor in accordance with the tenth embodiment. Parts or elements that correspond to those in FIG. 1 have been provided with the same reference numerals.

As illustrated in FIG. 18, a basic cell of CMOS sensor in accordance with the tenth embodiment is comprised of a p-type semiconductor substrate 101, a p-type well layer 102 formed in the semiconductor substrate 101 and partially exposed at a surface of the p-type semiconductor substrate 101, p+ semiconductor regions 103a and 103b exposed at a surface of the p-type semiconductor substrate 101, and isolating a region from adjacent regions in each of which a semiconductor device is fabricated, a third region or n-type semiconductor region 107 sandwiched between the p-type well 102 and the p+ semiconductor region 103a, a first region or n+ semiconductor region 106 formed in the third region or n-type semiconductor region 107, a fifth region or n− semiconductor region 110 formed on the p-type well layer 102 and sandwiched between the p+ semiconductor region 103a and the third region or n-type semiconductor region 107, a sixth region or p+ semiconductor region comprising a plurality of sub-regions 111a and 111b, and formed on the fifth region or n− semiconductor region 110, a n+ semiconductor region 105 sandwiched between the p-type well 102 and the p+ semiconductor region 103b, a control MOSFET 201 having a gate electrode in facing relation to a part of the p-type well 102 appearing at a surface of the p-type semiconductor substrate 101, a first MOSFET 202 acting as a source follower amplifier, and a second MOSFET 203 acting as a horizontal selection switch.

The tenth embodiment is structurally different from the ninth embodiment illustrated in FIG. 17 only in that CMOS sensor includes a plurality of sub-regions constituting the sixth region, in place of the single sixth region or p+ semiconductor region 111.

That is, the sixth region in the tenth embodiment is comprised of a first sub-region 111a consisting of a p+ semiconductor region and a second sub-region 111b consisting of a p+ semiconductor region. The first sub-region 111a is formed on the fifth region 110 and adjacent to the third region 107, and the second subregion 111b is formed on the fifth region 110 and adjacent to the first sub-region 111a.

A ground voltage (GND) is applied to the first sub-region or p+ semiconductor region 111a.

The second sub-region 111b is designed to contain an n-type impurity at a higher concentration than that of the first sub-region 111a.

A photoelectric transfer section 310 in the tenth embodiment is comprised of the first region or n+ semiconductor region 106, the third region or n-type semiconductor region 107, the fifth region or n− semiconductor region 110, and the first sub-region or p+ semiconductor region 111a and the second subregion or p+ semiconductor region 111b both constituting the sixth region together.

The fifth region or n− semiconductor region 110 is made depleted by a high level potential of the control MOSFET 201.

A depletion layer is formed at a junction between the p-type well layer 102 and the p+ semiconductor region 103a, and the fifth and sixth regions 110 and 111a, 111b. In accordance with the tenth embodiment, it is possible to extend the depletion layer towards the photoelectric transfer section 310. Hence, a parasitic capacity C of the photoelectric transfer section 310 can be reduced, which ensures great potential variation V caused by signal electric charges, and which further ensures enhancement in an output transfer efficiency.

Though the fifth region or n− semiconductor region 110 is made depleted, similarly to the ninth embodiments, the fifth region or n− semiconductor region 110 cooperate with the first region 106 and the third region 107 to thereby define the photoelectric transfer section 310. Signal electric charges generated by photoelectric transfer are accumulated first in the first region 106 having a deeper potential, and secondly in the third region 107, as illustrated in a lower part of FIG. 18.

In addition, similarly to the seventh embodiment, a parasitic capacity C1 of the photoelectric transfer section 310, associated with a reset potential VDD, where signal electric charges are being accumulated in the first region 106, to a first potential "a" is smaller than a parasitic capacity C2 of the photoelectric transfer section 310, associated with the first potential "a" to a second potential "b" where signal electric charges are accumulated in the first sub-region 111a. Furthermore, the parasitic capacity C2 is smaller than a parasitic capacity C3 of the photoelectric transfer section 310, associated with the second potential "b" to a third potential "c" where signal electric charges are accumulated in the second sub-region 111b. Hence, as illustrated in FIG. 15, there is obtained a three-stage characteristic between an amount of incident lights and an output voltage, ensuring a high dynamic range.

In addition, in the tenth embodiment, since the sixth region 111a and 111b both consisting of a heavily doped p-type semiconductor region and fixed at the ground voltage is formed on the fifth region 110 consisting of a lightly doped n-type semiconductor region and caused depleted, a current generated at an interface between silicon and an oxide film can be eliminated by recombination, ensuring reduction in noises not caused by photoelectric transfer.

The fifth region 110 and the first and second sub-regions 111a and 111b constituting the sixth region in the tenth embodiment may be formed in CMOS sensor in accordance with the first embodiment, illustrated in FIG. 5. When they are applied to CMOS sensor in accordance with the first embodiment, they are formed between the p+ semiconductor region 103a and the second region or n-type semiconductor region 114.

In the tenth embodiment, the sixth region is designed to include two sub-regions 111a and 111b. However, the number of sub-regions constituting the sixth region is not to be limited to two. The sixth region may be designed to be comprised of three or more sub-regions, in which case, a sub-region located closer to the third region 107 may contain an impurity at a higher concentration.

The above-mentioned first to tenth embodiments may be modified.

For instance, the number of semiconductor regions is not to be limited to the number shown in each of the embodiments.

In the above-mentioned embodiments, a gate of the control MOSFET is designed to reset a potential of the photoelectric transfer section to a desired potential. However, it should be noted that the control gate may be designed to achieve other operations as well as potential-reset operation.

The first region or n+ semiconductor region 106 and the n+ semiconductor region 105 may be formed as a common layer.

In each of the embodiments, the semiconductor regions may be designed to have an opposite electrical conductivity. For instance, a p-type semiconductor region may be turned into an n-type semiconductor region, and an n-type semiconductor region may be turned into a p-type semiconductor region.

In each of the embodiments, an n-type semiconductor substrate may be employed in place of the p-type semiconductor substrate 101.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-83179 filed on Mar. 30, 1998 including specification, claims, drawings and summary is incorporated herein by reference in its entirety.

What is claimed is:

1. A solid-state image sensor comprising:
  (a) a semiconductor layer having a second electrical conductivity;
  (b) a photoelectric transfer section for converting a light into electric charges, formed on said semiconductor layer;
  (c) a control transistor formed above said semiconductor layer for controlling operation of said photoelectric transfer section; and
  (d) a source follower transistor for outputting therethrough a voltage caused by said electric charges,
  said photoelectric transfer section including:
    (a) a first region having a first electrical conductivity, extending to a gate electrode of said control transistor, and being in electrical connection with a gate electrode of said source follower transistor; and
    (b) a second region having a first electrical conductivity and formed adjacent to said first region.

2. The solid-state image sensor as set forth in claim 1, wherein a diffusion layer located opposite to said first region about said control transistor has the same electrical conductivity and the same impurity concentration as those of said first region.

3. The solid-state image sensor as set forth in claim 1, wherein said second region has a smaller impurity concentration than that of said first region.

4. The solid-state image sensor as set forth in claim 1, wherein said first region is in electrical connection with a gate electrode of said source follower transistor.

5. The solid-state image sensor as set forth in claim 1, wherein said control transistor resets a potential of said photoelectric transfer section into a desired potential.

6. A solid-state image sensor comprising:
  (a) a semiconductor layer having a second electrical conductivity;
  (b) a photoelectric transfer section for converting a light into electric charges, formed on said semiconductor layer;
  (c) a control transistor formed above said semiconductor layer for controlling operation of said photoelectric transfer section; and
  (d) a source follower transistor for outputting therethrough a voltage caused by said electric charges,
  said photoelectric transfer section including:
    (a) a first region having a first electrical conductivity, extending to a gate electrode of said control transistor, and being in electrical connection with a gate electrode of said source follower transistor;
    (b) a second region having a first electrical conductivity and formed adjacent to said first region; and
    (c) a third region having a first electrical conductivity and formed adjacent to said first region.

7. The solid-state image sensor as set forth in claim 6, wherein said third region is comprised of a plurality of sub-regions.

8. The solid-state image sensor as set forth in claim 6, wherein said second and third regions are caused depleted by a high level voltage of said control transistor, and a depletion voltage level of said second region is deeper than a depletion voltage level of said third region.

9. The solid-state image sensor as set forth in claim 7, wherein said second region and said sub-regions of said third region are caused depleted by a high level voltage of said control transistor, a depletion voltage level of said second region is deeper than a depletion voltage level of said sub-regions of said third region, and a depletion voltage level in each one of said sub-regions of said third region, located closer to said first region is deeper.

10. The solid-state image sensor as set forth in claim 7, wherein said sub regions of said third region have almost the same impurity concentration.

11. The solid-state image sensor as set forth in claim 7, wherein a sub-region of a fourth region which is located closer to said third region has a higher impurity concentration than the other sub-regions of said fourth region.

12. The solid-state image sensor as set forth in claim 6, wherein said first region has almost the same impurity concentration as that of said third region.

13. The solid-state image sensor as set forth in claim 6, wherein said second region has a smaller impurity concentration than that of said first region.

14. The solid-state image sensor as set forth in claim 6, wherein said first region is in electrical connection with a gate electrode of said source follower transistor.

15. The solid-state image sensor as set forth in claim 6, wherein a diffusion layer located opposite to said first region about said control transistor has the same electrical conductivity and the same impurity concentration as those of said first region.

16. The solid-state image sensor as set forth in claim 6, wherein said control transistor resets a potential of said photoelectric transfer section into a desired potential.

17. A solid-state image sensor comprising:
 (a) a semiconductor layer having a second electrical conductivity;
 (b) a photoelectric transfer section for converting a light into electric charges, formed on said semiconductor layer;
 (c) a control transistor formed above said semiconductor layer for controlling operation of said photoelectric transfer section; and
 (d) a source follower transistor for outputting there through a voltage caused by said electric charges,
 said photoelectric transfer section including:
  (a) a first region having a first electrical conductivity, extending to a gate electrode of said control transistor, and being in electrical connection with a gate electrode of said source follower transistor;
  (b) a second region having a first electrical conductivity and formed adjacent to said first region;
  (c) a third region having a first electrical conductivity and formed on said semiconductor layer and adjacent to said second region; and
  (d) a fourth region having a second electrical conductivity and formed on said third region.

18. The solid-state image sensor as set forth in claim 17, wherein said fourth region is comprised of a plurality of sub-regions.

19. The solid-state image sensor as set forth in claim 18, wherein said sub regions of said fourth region have almost the same impurity concentration.

20. The solid-state image sensor as set forth in claim 18, wherein a sub-region of said fourth region located closer to said first region has a higher impurity concentration than the other sub-regions of said fourth region.

21. The solid-state image sensor as set forth in claim 17, wherein said second region has a smaller impurity concentration than that of said first region.

22. The solid-state image sensor as set forth in claim 17, wherein said first region is in electrical connection with a gate electrode of said source follower transistor.

23. The solid-state image sensor as set forth in claim 17, wherein a diffusion layer located opposite to said first region about said control transistor has the same electrical conductivity and the same impurity concentration as those of said first region.

24. The solid-state image sensor as set forth in claim 17, wherein said control transistor resets a potential of said photoelectric transfer section into a desired potential.

25. A solid-state image sensor comprising:
 (a) a semiconductor layer having a second electrical conductivity;
 (b) a photoelectric transfer section for converting a light into electric charges, formed on said semiconductor layer;
 (c) a control transistor formed above said semiconductor layer for controlling operation of said photoelectric transfer section; and
 (d) a source follower transistor for outputting there through a voltage caused by said electric charges,
 said photoelectric transfer section including:
  (a) a first region having a first electrical conductivity, and being in electrical connection with a gate electrode of said source follower transistor; and
  (b) a second region having a first electrical conductivity and formed in said first region.

26. The solid-state image sensor as set forth in claim 25, wherein said first and said second regions are not caused depleted by a high level voltage of said control transistor.

27. The solid-state image sensor as set forth in claim 25, wherein said first region has a smaller impurity concentration than that of said second region.

28. The solid-state image sensor is set forth in claim 25, wherein said third region is in electrical connection with a gate electrode of said source follower transistor.

29. The solid-state image sensor as set forth in claim 25, wherein a diffusion layer located opposite to a first region about said control transistor has the same electrical conductivity and the same impurity concentration as those of said third region.

30. The solid-state image sensor as set forth in claim 25, wherein said control transistor resets a potential of said photoelectric transfer section into a desired potential.

31. A solid-state image sensor comprising:
 (a) a semiconductor layer having a second electrical conductivity;
 (b) a photoelectric transfer section for converting a light into electric charges, formed on said semiconductor layer;
 (c) a control transistor formed above said semiconductor layer for controlling operation of said photoelectric transfer section; and
 (d) a source follower transistor for outputting there through a voltage caused by said electric charges,
 said photoelectric transfer section including:
  (a) a first region having a first electrical conductivity, and being in electrical connection with a gate electrode of said source follower transistor; and
  (b) a second region having a first electrical conductivity and formed in said first region; and
  (c) a third region having a first electrical conductivity and formed adjacent to said first region.

32. The solid-state image sensor as set forth in claim 31, wherein said second region is surrounded entirely with said first region.

33. The solid-state image sensor as set forth in claim 31, wherein said second region is surrounded partially with said first region, and is adjacent to said third region at a portion not surrounded by said first region.

34. The solid-state image sensor as set forth in claim 31, wherein said third region is comprised of a plurality of sub-regions.

35. The solid-state image sensor as set forth in claim 31, wherein a fifth region and said third region are caused depleted by a high level voltage of said control transistor, and a depletion voltage level of said fifth region is deeper than a depletion voltage level of said third region.

36. The solid-state image sensor as set forth in claim 34, wherein a fifth region and said sub-regions of said third region are caused depleted by a high level voltage of said control transistor, a depletion voltage level of said fifth region is deeper than a depletion voltage level of said sub-regions of said third region, and a depletion voltage level in each one of said sub-regions of said third region, located closer to said second region is deeper.

37. The solid-state image sensor as set forth in claim 31, wherein said first and third regions have a smaller impurity concentration than that of said second region.

38. The solid-state image sensor as set forth in claim 31, wherein said third region has a smaller impurity concentration than that of said first region.

39. The solid-state image sensor as set forth in claim 34, wherein said sub regions of said third region have almost the same impurity concentration.

40. The solid-state image sensor as set forth in claim 34, wherein a sub-region of said third region which is located closer to said first region has a higher impurity concentration than the other sub-regions of said third region.

41. The solid-state image sensor as set forth in claim 31, wherein said second region has almost the same impurity concentration as that of said third region.

42. The solid-state image sensor as set forth in claim 31, wherein said second and first region are not caused depleted by a high level voltage of said control transistor.

43. The solid-state image sensor as set forth in claim 31, wherein a diffusion layer located opposite to said second region about said control transistor has the same electrical conductivity and the same impurity concentration as those of said second region.

44. The solid-state image sensor as set forth in claim 31, wherein said first region has a smaller impurity concentration than that of said second region.

45. The solid-state image sensor as set forth in claim 31, wherein said second region is in electrical connection with a gate electrode of said source follower transistor.

46. The solid-state image sensor as set forth in claim 31, wherein said control transistor resets a potential of said photoelectric transfer section into a desired potential.

47. A solid-state image sensor comprising:
 (a) a semiconductor layer having a second electrical conductivity;
 (b) a photoelectric transfer section for converting a light into electric charges, formed on said semiconductor layer;
 (c) a control transistor formed above said semiconductor layer for controlling operation of said photoelectric transfer section; and
 (d) a source follower transistor for outputting there through a voltage caused by said electric charges,
 said photoelectric transfer section including:
  (a) a first region having a first electrical conductivity, and being in electrical connection with a gate electrode of said source follower transistor; and
  (b) a second region having a first electrical conductivity and formed in said first region;
  (c) a third region having a first electrical conductivity and formed on said semiconductor layer and adjacent to said first region; and
  (d) a fourth region having a second electrical conductivity and formed on said third region.

48. The solid-state image sensor as set forth in claim 47, wherein said fourth region is comprised of a plurality of sub-regions.

49. The solid-state image sensor as set forth in claim 48, wherein said sub regions of said fourth region have almost the same impurity concentration.

50. The solid-state image sensor as set forth in claim 48, wherein a sub region of said fourth region located closer to said first region has a higher impurity concentration.

51. The solid-state image sensor as set forth in claim 47, wherein said second region is surrounded entirely with said first region.

52. The solid-state image sensor as set forth in claim 47, wherein said second region is surrounded partially with said first region, and is adjacent to said third and fourth regions at a portion not surrounded by said first region.

53. The solid-state image sensor as set forth in claim 47, wherein said second and first regions are not caused depleted by a high level voltage of said control transistor.

54. The solid-state image sensor as set forth in claim 47, wherein a diffusion layer located opposite to said second region about said control transistor has the same electrical conductivity and the same impurity concentration as those of said second region.

55. The solid-state image sensor as set forth in claim 47, wherein said first region has a smaller impurity concentration than that of said second region.

56. The solid-state image sensor as set forth in claim 47, wherein said second region is in electrical connection with a gate electrode of said source follower transistor.

57. The solid-state image sensor as set forth in claim 47, wherein said control transistor resets a potential of said photoelectric transfer section into a desired potential.

* * * * *